United States Patent
Sasai et al.

(10) Patent No.: US 10,757,414 B2
(45) Date of Patent: Aug. 25, 2020

(54) ARITHMETIC DECODING METHOD AND ARITHMETIC CODING METHOD

(71) Applicant: Sun Patent Trust, New York, NY (US)

(72) Inventors: Hisao Sasai, Osaka (JP); Takahiro Nishi, Nara (JP); Youji Shibahara, Tokyo (JP); Toshiyasu Sugio, Osaka (JP)

(73) Assignee: SUN PATENT TRUST, New York, NY (US)

( * ) Notice: Subject to any disclaimer, the term of this patent is extended or adjusted under 35 U.S.C. 154(b) by 0 days.

(21) Appl. No.: 16/575,717

(22) Filed: Sep. 19, 2019

(65) Prior Publication Data
US 2020/0014930 A1 Jan. 9, 2020

Related U.S. Application Data

(63) Continuation of application No. 15/895,283, filed on Feb. 13, 2018, now Pat. No. 10,462,463, which is a (Continued)

(51) Int. Cl.
*H04N 19/13* (2014.01)
*H03M 7/40* (2006.01)
(Continued)

(52) U.S. Cl.
CPC .......... *H04N 19/13* (2014.11); *H03M 7/4018* (2013.01); *H04N 19/10* (2014.11); (Continued)

(58) Field of Classification Search
CPC ...... H04N 19/13; H04N 19/10; H04N 19/197; H04N 19/167; H04N 19/44; H04N 19/157; H03M 7/4018
See application file for complete search history.

(56) References Cited

U.S. PATENT DOCUMENTS

| | | |
|---|---|---|
| 7,095,344 B2 | 8/2006 | Sekiguchi et al. |
| 7,190,289 B2 | 3/2007 | Kobayashi et al. |

(Continued)

FOREIGN PATENT DOCUMENTS

| | | |
|---|---|---|
| JP | 2011-24001 | 2/2011 |
| WO | 03/092168 | 11/2003 |
| WO | 03/092169 | 11/2003 |

OTHER PUBLICATIONS

International Search Report dated May 22, 2012 in corresponding International Application No. PCT/JP2012/001051.
(Continued)

*Primary Examiner* — Tracy Y. Li
(74) *Attorney, Agent, or Firm* — Wenderoth, Lind & Ponack, L.L.P.

(57) ABSTRACT

An arithmetic decoding method is a method in which a context variable specifying a probability of a possible value of each of elements included in a binary string corresponding to a value of a given variable is initialized and arithmetic decoding is performed, using the context variable. The method includes: determining, from among a plurality of initialization methods as a method of initializing the context variable, an initialization method corresponding to the given variable or a group which includes the given variable; and initializing the context variable using the determined initialization method.

2 Claims, 26 Drawing Sheets

Related U.S. Application Data continuation of application No. 15/059,502, filed on Mar. 3, 2016, now Pat. No. 9,930,336, which is a continuation of application No. 13/816,341, filed as application No. PCT/JP2012/001051 on Feb. 17, 2012, now Pat. No. 9,319,675.

(60) Provisional application No. 61/446,128, filed on Feb. 24, 2011.

(51) Int. Cl.
    *H04N 19/157*      (2014.01)
    *H04N 19/44*      (2014.01)
    *H04N 19/167*      (2014.01)
    *H04N 19/196*      (2014.01)
    *H04N 19/10*      (2014.01)

(52) U.S. Cl.
    CPC ......... *H04N 19/157* (2014.11); *H04N 19/167* (2014.11); *H04N 19/197* (2014.11); *H04N 19/44* (2014.11)

(56) References Cited

U.S. PATENT DOCUMENTS

| | | | |
|---|---|---|---|
| 7,298,303 B2 | 11/2007 | Kobayashi et al. | |
| 7,321,323 B2 | 1/2008 | Sekiguchi et al. | |
| 7,388,526 B2 | 6/2008 | Sekiguchi et al. | |
| 7,408,488 B2 | 8/2008 | Sekiguchi et al. | |
| 7,518,537 B2 | 4/2009 | Sekiguchi et al. | |
| RE41,729 E | 9/2010 | Sekiguchi et al. | |
| 7,859,438 B2 | 12/2010 | Sekiguchi et al. | |
| 7,928,869 B2 | 4/2011 | Sekiguchi et al. | |
| 7,994,951 B2 | 8/2011 | Sekiguchi et al. | |
| 8,094,049 B2 | 1/2012 | Sekiguchi et al. | |
| 8,188,895 B2 | 5/2012 | Sekiguchi et al. | |
| 8,203,470 B2 | 6/2012 | Sekiguchi et al. | |
| 2004/0151252 A1 | 8/2004 | Sekiguchi et al. | |
| 2005/0012648 A1* | 1/2005 | Marpe | H03M 7/4006 341/107 |
| 2005/0146451 A1 | 7/2005 | Kobayashi et al. | |
| 2006/0109149 A1 | 5/2006 | Sekiguchi et al. | |
| 2006/0202872 A1 | 9/2006 | Kobayashi et al. | |
| 2007/0205927 A1 | 9/2007 | Sekiguchi et al. | |
| 2007/0263723 A1 | 11/2007 | Sekiguchi et al. | |
| 2007/0296613 A1 | 12/2007 | Hussain | |
| 2008/0122662 A1* | 5/2008 | Hu | H03M 7/4006 341/51 |
| 2008/0158027 A1 | 7/2008 | Sekiguchi et al. | |
| 2009/0153378 A1 | 6/2009 | Sekiguchi et al. | |
| 2009/0273491 A1* | 11/2009 | Sakaguchi | H04N 19/91 341/51 |
| 2010/0098155 A1 | 4/2010 | Demircin et al. | |
| 2010/0315270 A1 | 12/2010 | Sekiguchi et al. | |
| 2011/0095922 A1 | 4/2011 | Sekiguchi et al. | |
| 2011/0102210 A1 | 5/2011 | Sekiguchi et al. | |
| 2011/0102213 A1 | 5/2011 | Sekiguchi et al. | |
| 2011/0115656 A1 | 5/2011 | Sekiguchi et al. | |
| 2011/0148674 A1 | 6/2011 | Sekiguchi et al. | |
| 2012/0014433 A1* | 1/2012 | Karczewicz | H04N 19/13 375/240.02 |
| 2012/0044099 A1 | 2/2012 | Sekiguchi et al. | |
| 2012/0081241 A1 | 4/2012 | Misra | |

OTHER PUBLICATIONS

"Advanced video coding for generic audiovisual services", ITU-T Recommendation H. 264, Mar. 2009, pp. 230-233.
"Advanced video coding for generic audiovisual services", ITU-T Recommendation H. 264, Mar. 2010.

* cited by examiner

FIG. 2

Prior Art (H.264 table 9-11)

| SE | | 5 | 6 | 7 | | Significant_coeff [] | Last_significant_coeff [] |
|---|---|---|---|---|---|---|---|
| CtxIdx | | 70..72 | 73..76 | 77..84 | | 105..165 | 166..226 |

Prior Art (for H.264)

Prior Art (for H.264)

```
preCtxState=Clip3(1, 126, ((m* Clip3(0, 51, SliceQP_Y))>>4)+n)
if( preCtxState <= 63 ) {
    pStateIdx =63-preCtxState
    valMPS = 0
} else {
    pStateIdx = preCtxState-64
    valMPS = 1
}
```

FIG. 8

Combination of parameter(s) used in each of init_method [1...i]

| init_method [1...i] | ctrl_param[1...j] | | | | | |
|---|---|---|---|---|---|---|
| | param #1 | param #2 | param #3 | param #4 | ... | param #j |
| 1 | a(1,1) | a(1,2) | a(1,3) | a(1,4) | ... | a(1,j) |
| 2 | | | | | | |
| 3 | a(3,1) | | a(3,3) | a(3,4) | | |
| ... | | ... | | | ... | ... |
| i | a(i,1) | ... | | | | a(i,j) |

FIG. 14
(a)
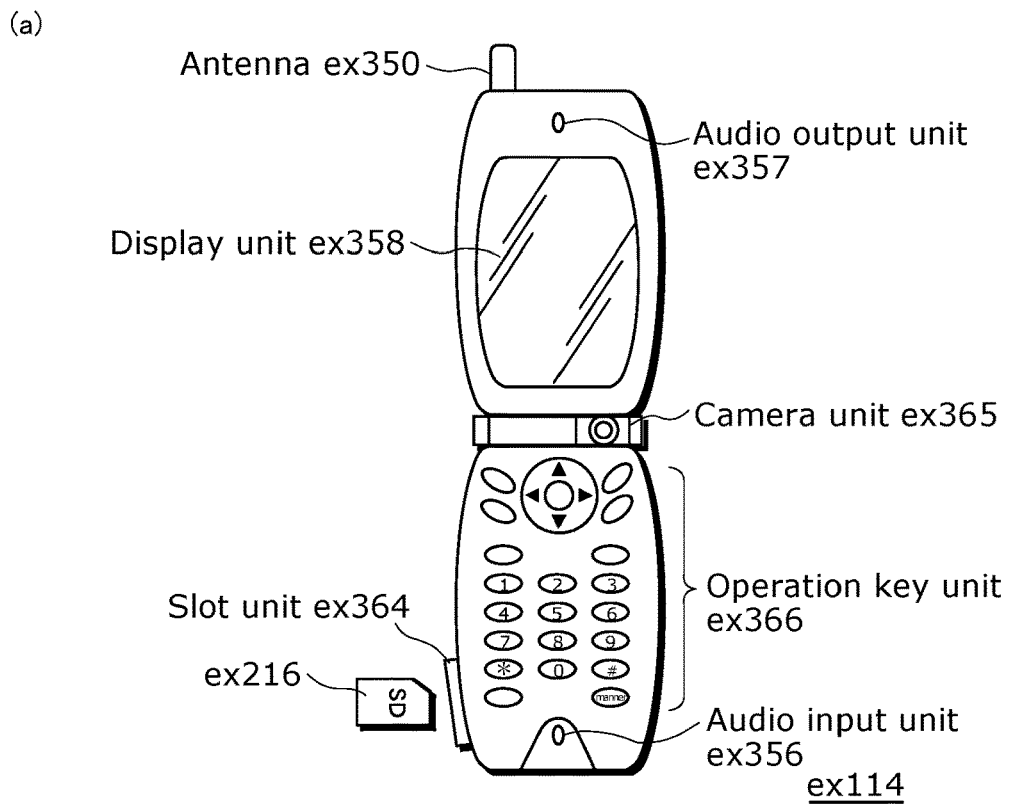
(b)
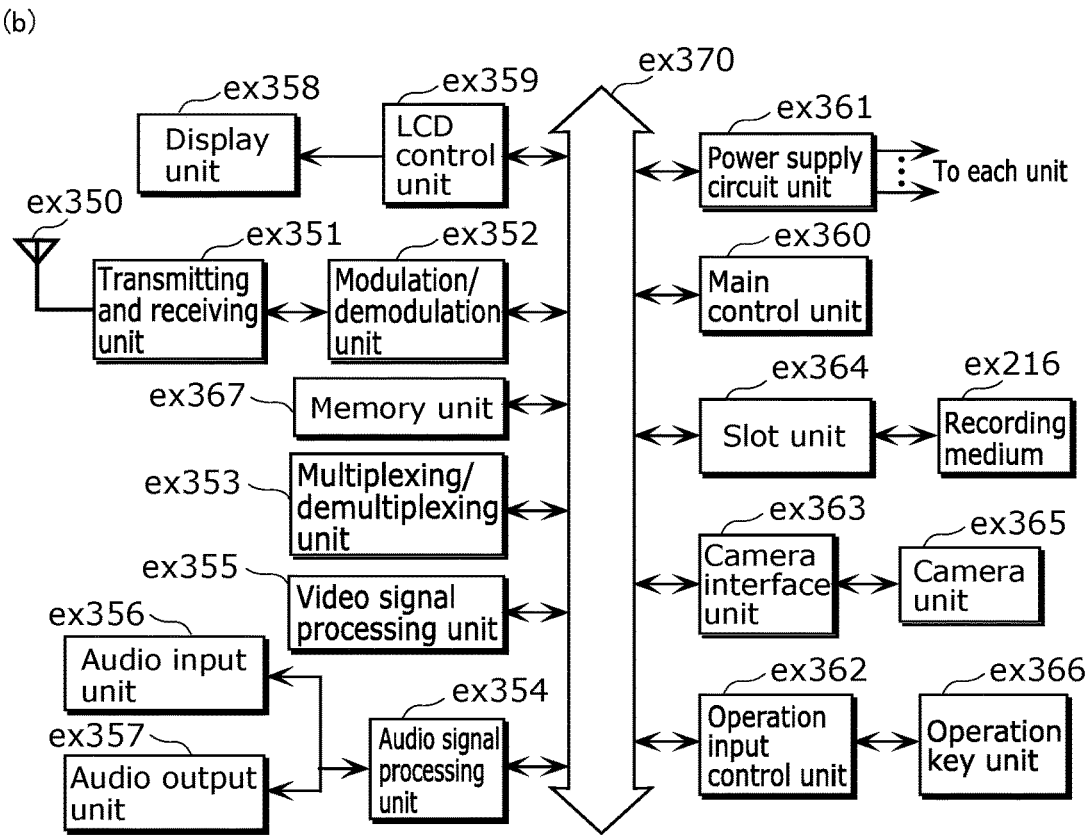

FIG. 15

| Video stream (PID=0x1011, Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00, Secondary video) |
| Video stream (PID=0x1B01, Secondary video) |

FIG. 26

| Corresponding standard | Driving frequency |
|---|---|
| MPEG-4 AVC | 500 MHz |
| MPEG-2 | 350 MHz |
| ⋮ | ⋮ |

FIG. 27
(a)
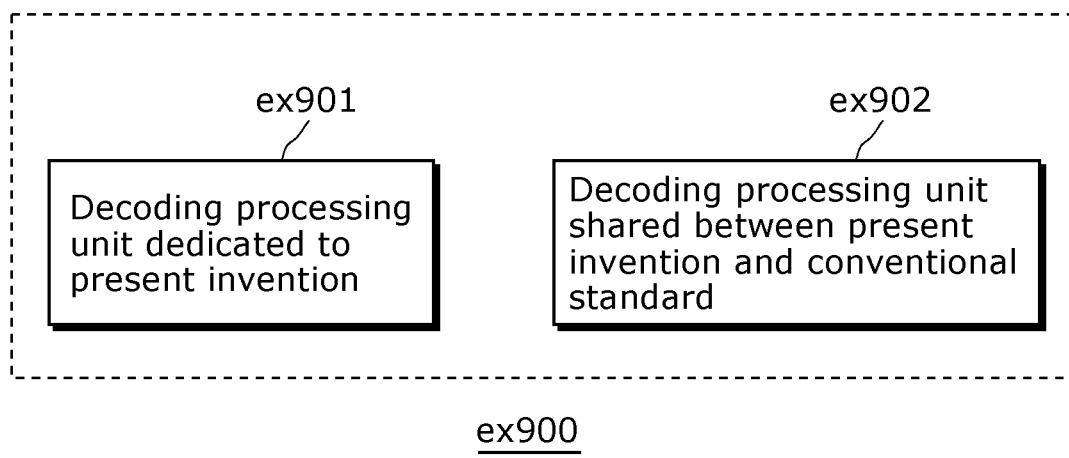
(b)
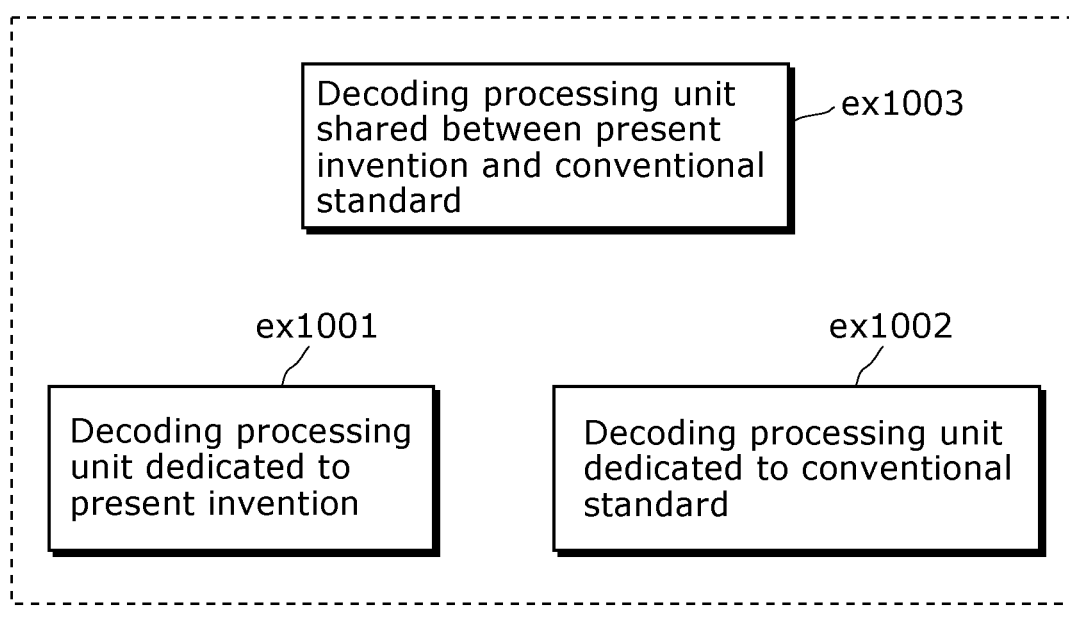

ARITHMETIC DECODING METHOD AND ARITHMETIC CODING METHOD

TECHNICAL FIELD

The present invention relates to a method of initializing context variables used for context based binary arithmetic coding or context based binary arithmetic decoding.

BACKGROUND ART

A method called H.264/MPEG-4 AVC (hereinafter, simply referred to as "H.264") is known as a method of coding and decoding moving pictures (Non-Patent Literature (NPL) 1). This method performs image compression through moving picture compression process such as frequency conversion, quantization and the like. Furthermore, the method adopts various entropy coding methods for reducing an amount of bits of a stream output relative to a code on which image compression has been performed.

In entropy coding methods, components of moving pictures may be used as contexts. H.264 adopts, as one of such entropy coding methods, context based variable length coding (VLC) scheme (section 9.2 in NPL 1) which switches between Huffman coding tables using contexts. H.264 further adopts, as another entropy coding method, an arithmetic coding method (section 9.3 in NPL 1) in which the value of a given variable is transformed into a binary string, and the probability of the value (0 or 1) of each element in the binary string is controlled using a context. In H.264, this arithmetic coding method, in which the probability of a binary value is given based on the context, is referred to as context-based adaptive binary arithmetic coding (CABAC).

In CABAC, a context is initialized on a per slice basis. More specifically, every time a slice which includes a current block to be coded or decoded changes, context variables for specifying the probability of the value of each element included in a binary string is initialized.

CITATION LIST

Non Patent Literature

[NPL 1]
ITU-T H.264 (March 2010)

SUMMARY OF INVENTION

Technical Problem

However, in conventional initialization of context variables, a single initialization method is substantially used for initializing all the context variables; and thus, the context variables may be improperly initialized.

The present invention has been conceived to solve such a problem, and has an object to provide an arithmetic decoding method and an arithmetic coding method for properly initializing context variables to increase coding efficiency.

Solution to Problem

In order to achieve the object, an arithmetic decoding method according to one aspect of the present invention is an arithmetic decoding method in which a context variable is initialized and arithmetic decoding is performed, using the context variable, on a binary string which corresponds to a value of a given variable, the context variable specifying a probability of a possible value of each of elements included in the binary string. The arithmetic decoding method includes: determining an initialization method from among a plurality of initialization methods as a method of initializing the context variable, the initialization method corresponding to the given variable or a group which includes the given variable; and initializing the context variable using the determined initialization method.

Furthermore, in order to achieve the object, an arithmetic coding method according to one aspect of the present invention is an arithmetic coding method in which a context variable is initialized and arithmetic coding is performed, using the context variable, on a binary string which corresponds to a value of a given variable, the context variable specifying a probability of a possible value of each of elements included in the binary string. The arithmetic coding method includes: determining an initialization method from among a plurality of initialization methods as an initialization method of the context variable, the determined initialization method corresponding to the given variable or a group which includes the given variable; and initializing the context variable using the determined initialization method.

Advantageous Effects of Invention

According to the present invention, it is possible to properly initialize context variables, and increase coding efficiency.

BRIEF DESCRIPTION OF DRAWINGS

FIG. 2 is a diagram for explaining correspondence between variables and context variables.

FIG. 8 is a diagram showing correspondence between first to n-th initialization methods and control parameters, according to Embodiment 1.

In FIG. 14, (a) shows an example of a cellular phone, and (b) is a block diagram showing an example of a configuration of a cellular phone.

FIG. 15 illustrates a structure of multiplexed data.

FIG. 26 shows an example of a look-up table in which video data standards are associated with driving frequencies.

In FIG. 27, (a) is a diagram showing an example of a configuration for sharing a module of a signal processing unit, and (b) is a diagram showing another example of a configuration for sharing a module of the signal processing unit.

DESCRIPTION OF EMBODIMENTS

First, a description is given of background to the present invention.

Figure 1:
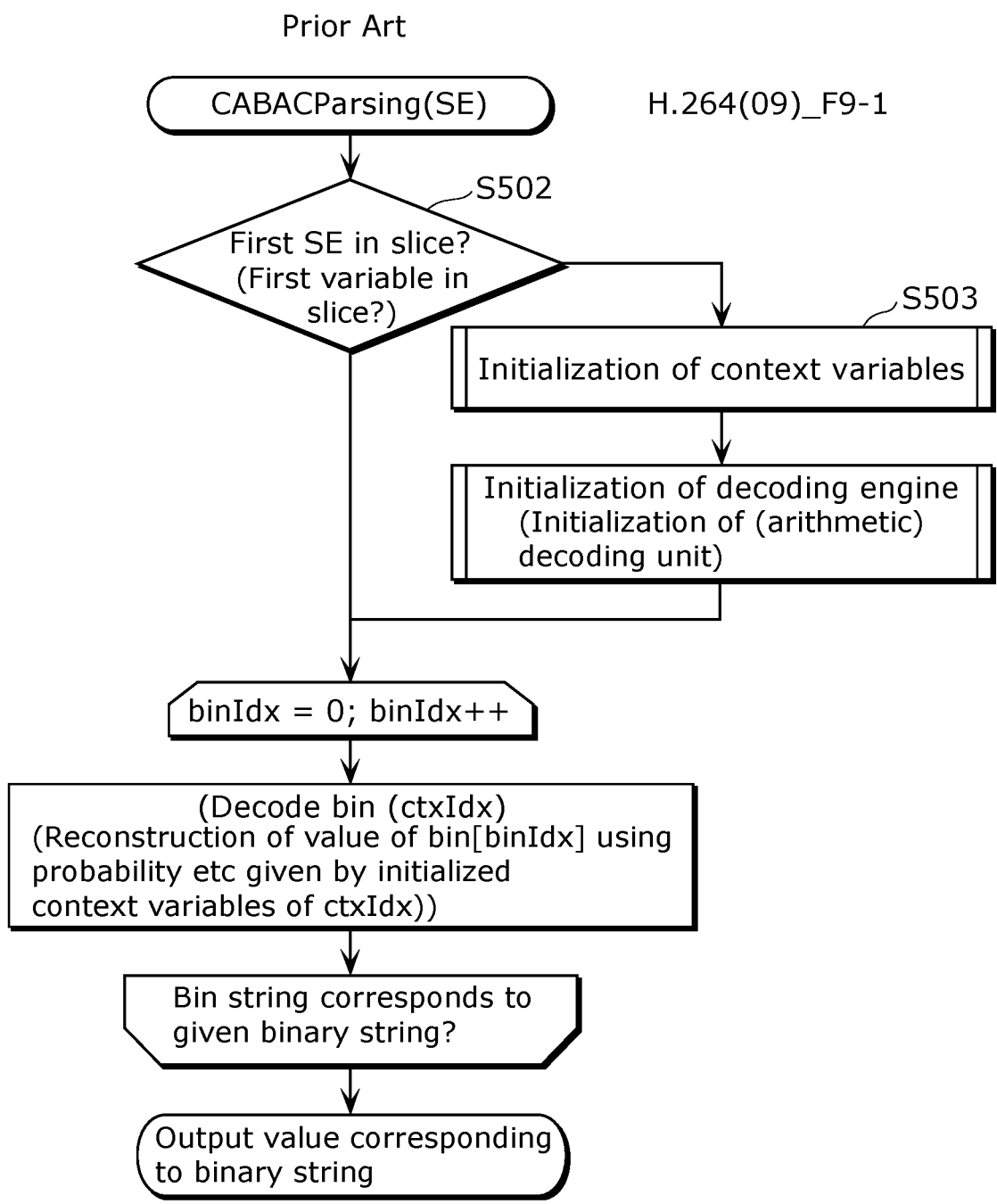
FIG. 1 is a flowchart of part of process for parsing a binary string coded according to CABAC.

FIG. 1 is a flowchart of part of process for parsing a binary string coded according to CABAC. More specifically, FIG. 1 is a flowchart of part of "CABAC parsing process for slice data" which is extracted from FIG. 9-1 of NPL 1, H.264 (09)_F9-1, and which is a process for parsing a binary string output as a result of coding a variable syntax element (SE) according to CABAC (including binarization process).

In H.264, CABAC coding is applied to a group of variables (defined by ae(v) type) included in the data structure which corresponds to a substantial portion of an image. The data structure which corresponds to the substantial portion of an image currently refers to, for example, data in a layer of slice data or lower layer (slice data (clause 7.3.4), or macroblock layer (clause 7.3.5).

On the other hand, CABAC coding is not applied to layers which are higher than slice data and which give control parameters for the slice data (slice header (clause 7.3.3), variables such as picture parameter set which gives control parameters for slices). Note that a variable refers to a variable given according to a rule of the data structure, or a variable derived according to a rule of the data structure. In the present invention, a variable refer to a variable included in the data structure of a coded stream. In the present description, SE refers to a syntax element, and is a variable (variable name).

In step S502, it is determined if a given variable (SE) is a first variable (SE) in a slice, regardless of its value (S502). This determination is for determining if initialization of context variables corresponding to the variable is necessary. For example, when a slice includes a plurality of macroblocks, and if the variable is associated with a first macroblock, the result of the determination is YES. If the variable is associated with a second or subsequent macroblock, and is a variable (SE) that is of a same type as the variable associated with the first macroblock, the result of the determination is NO. This is because even if the values of the variables are different, the variable of this type has already been initialized.

When the result of the determination of Step S502 is YES, initialization of context variables indicated by ctxIdx corresponding to the variable is executed (S503).

FIG. 2 is a diagram for explaining correspondence between variable (SE) and ctxIdx. More specifically, FIG. 2 is a table showing correspondence between variables and context indexes (ctxIdx) according to a conventional technique (H.264). The upper line indicates variables (signal type, SE), and the lower line indicates each ctxIdx corresponding to the upper variable.

For example, in the case where a variable (SE) is 5, and is Coded_block_pattern (luma), this variable is associated with a context having context indexes of 70 . . . 72 (70 or greater and 72 or smaller, hereinafter, same expression is used for expressing a range). Furthermore, in the case where a variable (SE) is 6, and is Coded_block_pattern (chroma), this variable is associated with context indexes of 73 . . . 76 so as not to overlap the other variables. In the similar manner, a variable (array type) Significant_coeff and a variable (array type) Last_significant_coeff are associated with different context indexes so as not to overlap each other for each of groups which group variables represented by data structure.

Figures 3A, 3B:
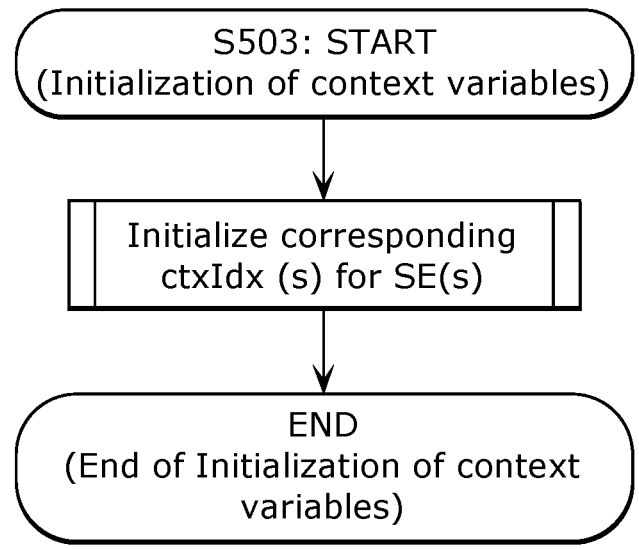
FIG. 3A is a diagram for explaining a method of initializing context variables.
FIG. 3B is another diagram for explaining a method of initializing context variables.

FIG. 3A and FIG. 3B each is a diagram for explaining a method of initializing context variables which correspond to a given variable. More specifically, FIG. 3A is a flowchart of a method of initializing context variables specified by respective context indexes derived in Step S503 (Initialization of context variables) in FIG. 1. FIG. 3B is a diagram showing a calculation method used in the method of initializing context variables. In other words, FIG. 3B shows calculating formulas applied to all of the ctxIdx (0 to 1023).

In this initialization method, (1) an initial value of pStateIdx which indicates one of 64 groups from 0 to 63 to which the probability belongs, and (2) an initial value of vaIMPS which indicates one of two values "0" and "1" which has a higher probability, are substantially derived by a single dynamic control parameter SliceQPy.

As shown in FIG. 3B, in order to determine the preStateIdx (0 . . . 63), preCtxState(1 . . . 126) is first derived. Here, m and n are constant numbers which respectively give a slope (m) and an intercept (n) in a case where preCtxState(y) is represented by a liner function of SliceQPy(x), and are statically determined in advance. Hence, this initialization method can be referred to as an initialization method substantially using a single control parameter (SliceQPy).

SliceQPy in H.264 is an initial value of QPy which is applied to each slice according to the value of the variable pic_init_qp_minus26 specified by a slice header per slice. This is a variable which represents an initial value of a quantization parameter for luminance applied to a slice (H.264 standard format 8-422 etc).

Hence, it is improper to initialize context variables corresponding to, for example, coded_block_pattern(chroma) that is a variable for chrominance, using only the value for luminance as a control parameter. In other words, it is not always proper to initialize context variables using the single initialization method determined only by the variable QPy for luminance.

Furthermore, the inventors are studying the following matters regarding related techniques.

More specifically, the inventors are studying formation of groups (first group to n-th group) in a view different from individual variable defined by the data structure (including a case where a different coefficient position is also counted as one variable). One view for the formation of groups is "types of control parameters". In this study, the inventors have found out that the initialization process described above, in which the control parameter "QPy" (quantization parameter for luminance) is statically used, is not the best for variables included in groups (first to n-th groups) formed based on the types of control parameters (#1 to # n).

Furthermore, when studying application of arithmetic coding applied to the image data portion (slice data layer or lower layers) extending to parameters for higher layers (including QP itself that is a control parameter), the inventors have found out that another control parameter is necessary which is different from QP for optimal initialization.

The arithmetic decoding method according to one aspect of the present invention is an arithmetic decoding method in which a context variable is initialized and arithmetic decoding is performed, using the context variable, on a binary string which corresponds to a value of a given variable, the context variable specifying a probability of a possible value of each of elements included in the binary string. The arithmetic decoding method includes: determining an initialization method from among a plurality of initialization methods as a method of initializing the context variable, the initialization method corresponding to the given variable or a group which includes the given variable; and initializing the context variable using the determined initialization method.

Furthermore, in the arithmetic decoding method according to another aspect of the present invention, it is preferable that at least one of the initialization methods depends on a quantization step for chrominance.

Furthermore, in the arithmetic decoding method according to another aspect of the present invention, it is preferable that at least one of the initialization methods depends on a maximum number of reference pictures.

Furthermore, in the arithmetic decoding method according to another aspect of the present invention, it is preferable that at least one of the initialization methods depends on a resolution of a picture.

Furthermore, in the arithmetic decoding method according to another aspect of the present invention, it is preferable that at least one of the initialization methods depends on a position of a slice.

Furthermore, the arithmetic coding method according to one aspect of the present invention is an arithmetic coding method in which a context variable is initialized and arithmetic coding is performed, using the context variable, on a binary string which corresponds to a value of a given variable, the context variable specifying a probability of a possible value of each of elements included in the binary string. The arithmetic coding method includes: determining an initialization method from among a plurality of initialization methods as an initialization method of the context variable, the determined initialization method corresponding to the given variable or a group which includes the given variable; and initializing the context variable using the determined initialization method.

Furthermore, in the arithmetic coding method according to another aspect of the present invention, it is preferable that at least one of the initialization methods depends on a quantization step of chrominance.

Furthermore, in the arithmetic coding method according to another aspect of the present invention, it is preferable that at least one of the initialization methods depends on a maximum number of reference pictures.

Furthermore, in the arithmetic coding method according to another aspect of the present invention, it is preferable that at least one of the initialization methods depends on a resolution of a picture.

Furthermore, in the arithmetic coding method according to another aspect of the present invention, it is preferable that at least one of the initialization methods depends on a position of a slice.

Hereinafter, detailed descriptions are given of embodiments of the present invention, referring to the drawings. Each of the embodiments described below shows a general or specific example. The numerical values, shapes, materials, structural elements, the arrangement and connection of the structural elements, steps, the processing order of the steps etc. shown in the following embodiments are mere examples, and therefore do not limit the present invention. The present invention is defined based on the Claims. Therefore, among the structural elements in the following embodiments, structural elements not recited in any one of the independent claims are not necessarily required to achieve the object of the present invention, but are described as structural elements for preferable embodiments.

Embodiment 1

Figure 4:
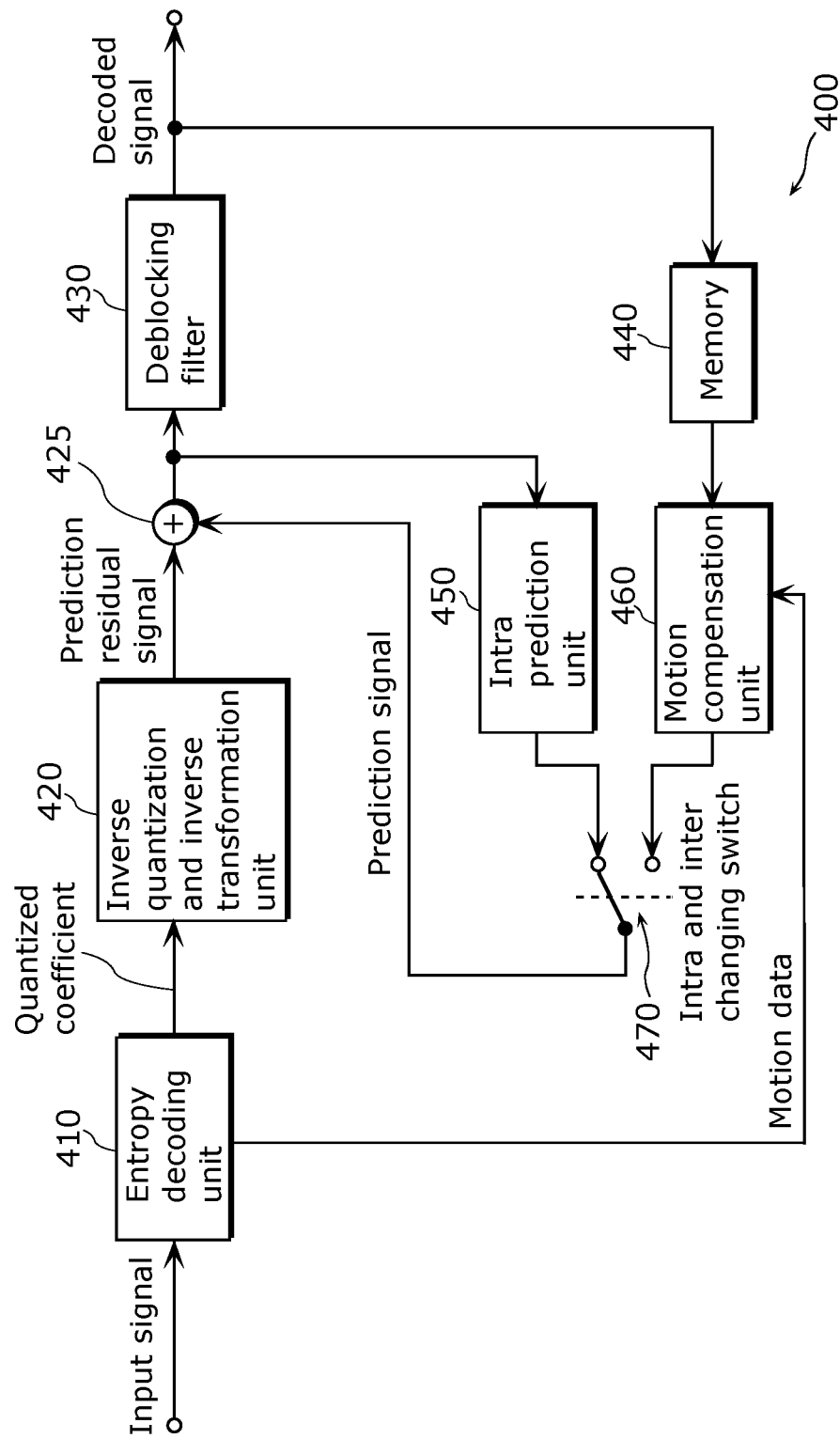
FIG. 4 is a block diagram showing an example of a configuration of an image decoding apparatus according to Embodiment 1.
Figure 5:
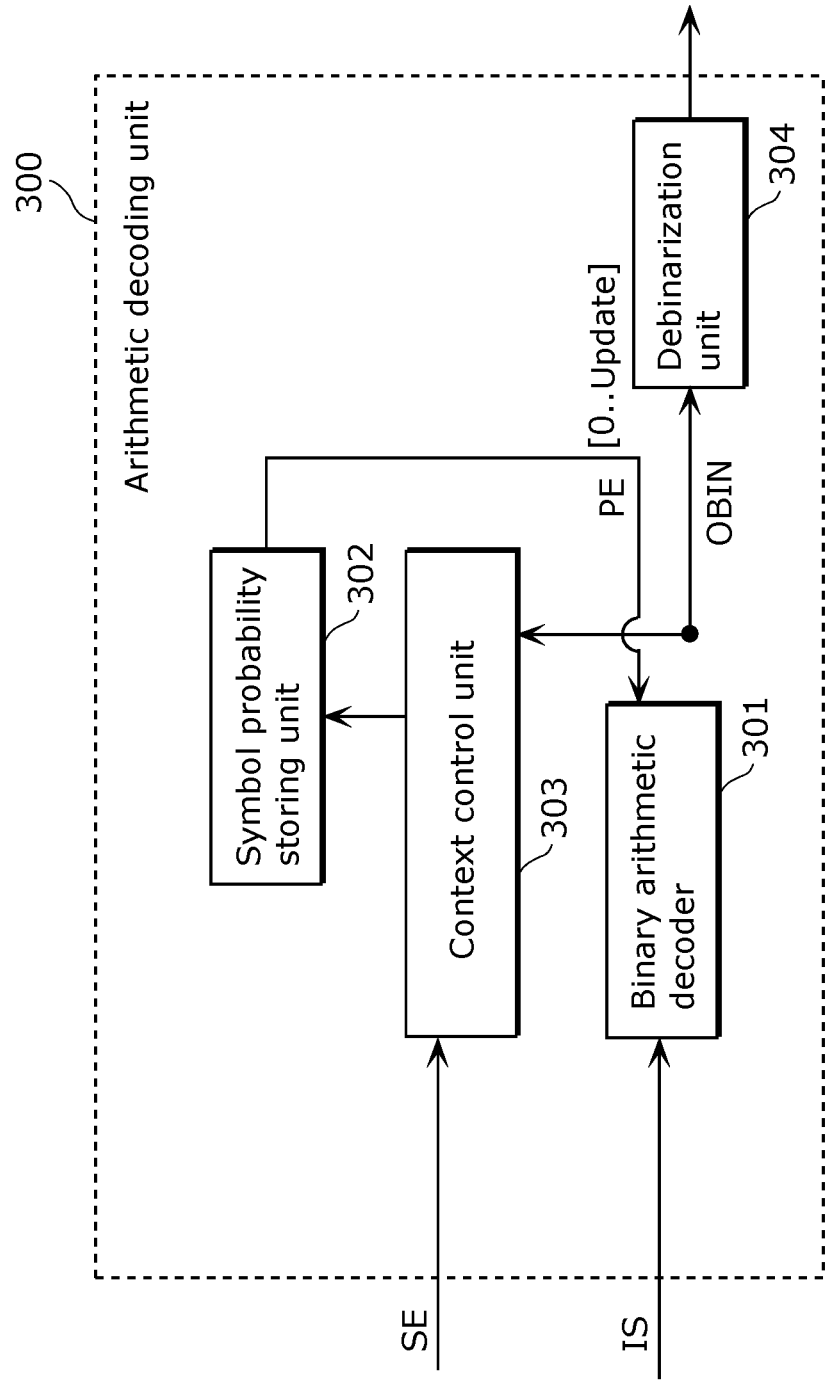
FIG. 5 is a block diagram showing an example of a configuration of an arithmetic decoding unit according to Embodiment 1.

FIG. 4 is a block diagram showing an example of a configuration of an image decoding apparatus 400 according to Embodiment 1. FIG. 5 is a block diagram showing an example of a configuration of an arithmetic decoding unit 300 according to Embodiment 1.

The arithmetic decoding unit 300 according to Embodiment 1 is included in the image decoding apparatus 400 which decodes coded image data generated by compression coding. First, a description is given of the image decoding apparatus 400 shown in FIG. 4.

The image decoding apparatus 400 decodes coded image data generated by compression coding. For example, the image decoding apparatus 400 receives, on a per block basis, coded image data as a current signal to be decoded. The image decoding apparatus 400 performs entropy decoding, inverse quantization, and inverse transformation on the received signal to be decoded, to reconstruct image data.

As shown in FIG. 4, the image decoding apparatus 400 includes: an entropy decoding unit 410; an inverse quantization and inverse transformation unit 420; an adder 425; a deblocking filter 430; a memory 440; an intra prediction unit 450; a motion compensation unit 460; and an intra and inter changing switch 470.

The entropy decoding unit 410 performs entropy decoding on an input signal (an input stream) to reconstruct quantized coefficients. The input signal (input stream) here refers to a current signal to be decoded, and corresponds to data in each block of coded image data. Furthermore, the entropy decoding unit 410 obtains motion data from the input signal, and outputs the obtained motion data to the motion compensation unit 460.

The inverse quantization and inverse transformation unit 420 performs inverse quantization on the quantized coefficients reconstructed by the entropy decoding unit 410 to reconstruct transform coefficients. The inverse quantization and inverse transformation unit 420 performs inverse transformation on the reconstructed transform coefficients, to reconstruct a prediction residual signal.

The adder 425 adds the reconstructed prediction residual signal and a prediction signal to generate a decoded image.

The deblocking filter 430 performs deblocking filtering on the generated decoded image. The decoded image on which deblocking filtering has been performed is output as a decoded signal.

The memory 440 is a memory for storing reference images to be used for motion compensation. More specifically, the memory 440 stores the decoded image on which deblocking filtering has been performed.

The intra prediction unit 450 performs intra prediction to generate a prediction signal (intra prediction signal). More specifically, the intra prediction unit 450 generates an intra prediction signal by performing intra prediction referring to images surrounding the current block to be decoded (input signal) in the decoded image generated by the adder 425.

The motion compensation unit 460 performs motion compensation based on the motion data output from the entropy decoding unit 410 to generate a prediction signal (inter prediction signal).

The intra and inter changing switch 470 selects one of the intra prediction signal and the inter prediction signal, and outputs the selected signal to the adder 425 as a prediction signal.

With the configuration above, the image decoding apparatus 400 according to Embodiment 1 decodes coded image data on which compression coding has been performed.

In FIG. 4, the arithmetic decoding unit 300 according to Embodiment 1 shown in FIG. 5 is included in the entropy decoding unit 410. More specifically, the arithmetic decoding unit 300 performs arithmetic decoding and debinarization on the coded image data on which prediction coding has been performed as an input stream IS. The signal type information SE is information which indicates, for example, the position of the quantized coefficient, the motion data, the direction of intra prediction used by the intra prediction unit 450.

Here, a description is given of the arithmetic decoding unit 300 shown in FIG. 5.

As shown in FIG. 5, the arithmetic decoding unit 300 includes: a binary arithmetic decoder 301; a symbol probability storing unit 302; a context control unit 303; and a debinarization unit 304.

The binary arithmetic decoder 301 performs arithmetic decoding on the input stream IS using probability information PE output from the symbol probability storing unit 302, to output a binary signal OBIN.

The symbol probability storing unit 302 stores, on a per context basis, context variables for specifying probability. The symbol probability storing unit 302 outputs probability PE to the binary arithmetic decoder 301, according to an instruction from the context control unit 303.

The context control unit 303 specifies the context which corresponds to the variable SE, and causes the symbol probability storing unit 302 to output the probability PE specified by the context variables of the context. The context control unit 303 updates the context variables stored in the symbol probability storing unit 302 to update the probability according to the value of the binary signal OBIN.

Furthermore, the context control unit 303 initializes the context variables stored in the symbol probability storing unit 302 when initialization of the context variables is necessary. A detailed description is given later of the initialization of the context variables.

The debinarization unit 304 performs debinarization on the binary signal OBIN to output quantized coefficient, motion data, or the like.

The initialization process of the context variables according to Embodiment 1 is executed by the context control unit 303. The other processing units (for example, a context group control unit (not shown)) is capable of determining or changing a group according to the value of a control signal, and providing a variable (or a group of variables (first to n-th groups) to the context control unit 303.

The coding apparatus and the decoding apparatus have to use common probability (or update model of probability). This is because if the coding apparatus which generates one range (the values which represent a range on a number line) and the decoding apparatus which interprets the values (range) do not use the same probability model (initial probability value, update rule), the framework of the arithmetic coding and decoding fails. Accordingly, the coding apparatus also performs the same context initialization process as that performed by the decoding apparatus, after the value of the control parameter is determined.

Figure 6:
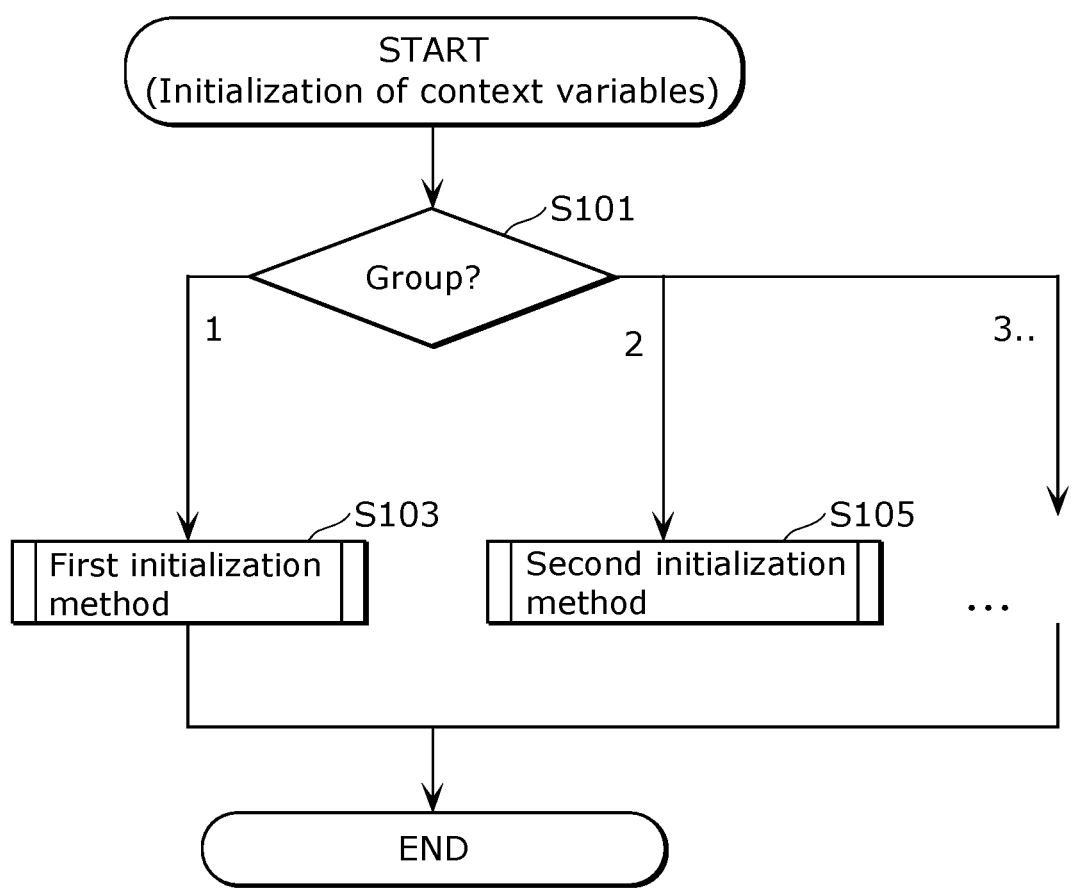
FIG. 6 is a flowchart of a method of initializing context variables according to Embodiment 1.

FIG. 6 is a flowchart of the process of initialization of context variables according to Embodiment 1. This initialization process is executed by the context control unit 303 when initialization of the context variables corresponding to a variable to be arithmetic coded is necessary.

Figure 7:
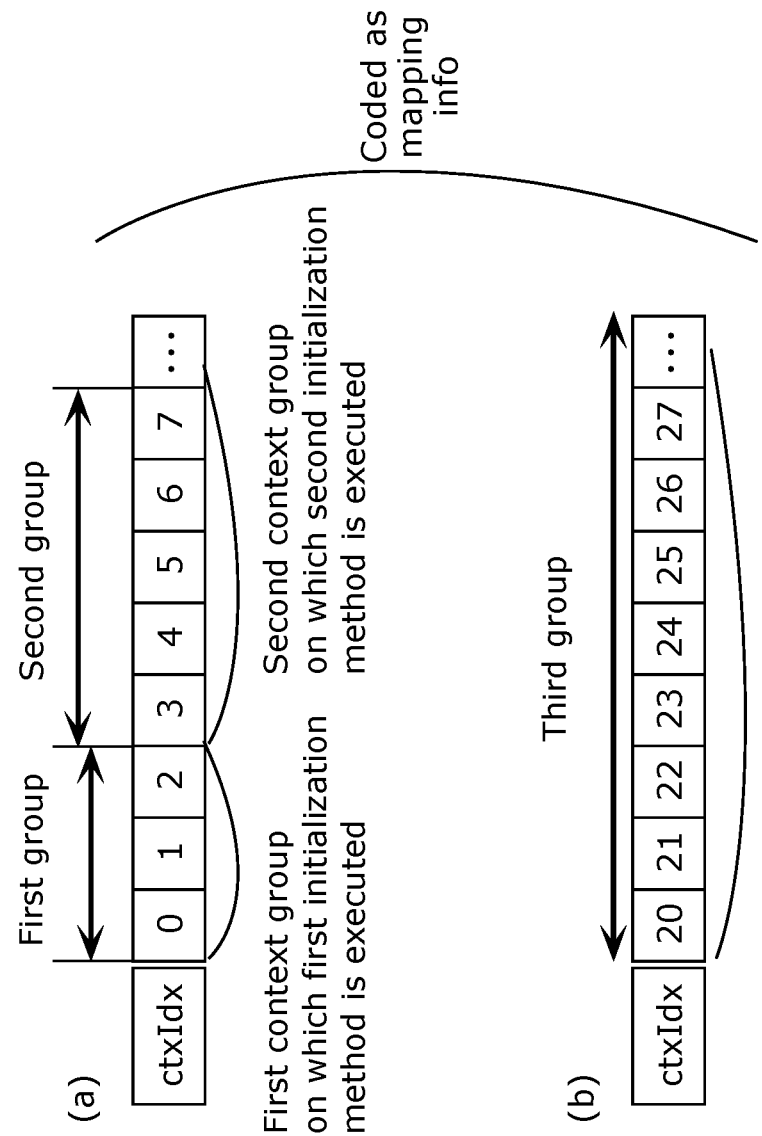
FIG. 7 is a diagram for explaining correspondence between variables (variable groups) and context indexes, according to Embodiment 1.

First, in step S101, the context control unit 303 determines which one of the first to n-th groups a variable to be parsed (a given variable) belongs to (S101). For example, the groups of the variables as shown in FIG. 7 are used.

Each group may be set for a group of variables, or for a group of contexts. Furthermore, each group does not always have to be set statically, but may be set dynamically. In the case where the groups dynamically change (or where the groups are specified by the coding side), the groups may be specified using indexes.

Next, in the case where the groups are 1, 2, . . . etc, the context control unit 303 executes different initialization methods (any one of the first to n-th initialization methods (where n is an integer number greater than or equal to 2)) depending on the groups (S103, S105 . . . ). Specifically, the context control unit 303 first determines, from among a plurality of initialization methods, an initialization method which corresponds to the determined group. The context control unit 303 then initializes the context variables corresponding to the variable to be parsed, using the determined initialization method.

Here, the initialization methods are associated with groups, but do not always have to be associated with the groups. For example, the initialization methods may be associated with variables to be parsed. Specifically, the context control unit 303 may determine, from among a plurality of initialization methods, an initialization method corresponding to a variable to be parsed.

Furthermore, the context control unit 303 may determine an initialization method corresponding to the group or variable, by, for example, referring to information which associates a group or a variable with an initialization method. It is sufficient that such information is stored, for example, in a storage unit (memory) or the like not shown.

FIG. 8 is a diagram showing correspondence between the first to n-th initialization methods (init_method[1 . . . i]) and combinations of 0 or more control parameters used for each initialization method. In the table shown in FIG. 8, rows indicate initialization method numbers, and columns indicate control parameter numbers (first to j-th control parameters). The coefficient a(i, j) specified by row and column numbers has, for example, the value of "0" or "1". The context control unit 303 is capable of specifying the parameters to be used by the first to n-th initialization methods, by referring to the table.

For example, the first initialization method (init_method [1]) uses only a first control parameter (param #1) as a control parameter. In this case, it is sufficient to be set in such a manner that a(1, 1)=1, and a(1, 2 . . . j)=0.

In such a manner, it is possible to provide valid or invalid state of the control parameters (param #1 to #j) or the degree of the application of the control parameters used in any initialization methods (the first to n-th initialization methods).

The following describes specific examples of respective control parameters. The control parameters described below are examples, and the control parameters according to the present invention are not limited to such control parameters.

The first control parameter (param #1) is, for example, a quantization step for luminance. Specifically, at least one of the first to n-th initialization methods may depend on the quantization step for luminance. Accordingly, as in the conventional method, it is possible to reflect, to the initialization method, the degree of correlation between a binary string and a quantization step for luminance.

The second control parameter (param #2) is, for example, a quantization step for chrominance. Specifically, at least one of the first to n-th initialization methods may depend on the quantization step for chrominance.

In the conventional method, only the degree of correlation between a binary string and a quantization step for luminance can be reflected to the initialization process. According to the method in Embodiment 1, the degree of correlation between a binary string and a quantization step for chrominance can also be reflected to the initialization process, using coding information on a chrominance signal. As a result, initialization process can be performed using the fact that the amount of information on chrominance is likely to increase when the quantization step for chrominance is smaller, allowing further increase in coding efficiency.

Here, the coding information on a chrominance signal refers to, for example, information on a prediction mode for chrominance, or information on coding of quantized coefficient for chrominance. More specifically, the coding information on a chrominance signal refers to information for distinguishing zero coefficient and non-zero coefficient, or information indicating the last position of a non-zero coefficient in a transform block.

The third control parameter (param #3) is, for example, the maximum number of reference frames. Specifically, at least one of the first to n-th initialization methods may depend on the maximum number of reference pictures.

In the conventional method, only the degree of correlation between a binary string and a quantization step of luminance can be reflected to the initialization process. According to the above method in Embodiment 1, it is possible to reflect the degree of correlation between a binary string and the maximum number of reference frames to the initialization process, using the coding information on the maximum number of reference frames. As a result, the initialization process can be performed using the fact that the amount of information on prediction of time direction decreases when the maximum number of reference frames is larger, allowing further increase in coding efficiency.

Here, the coding information on the maximum number of reference frames refers to, for example, information on motion prediction, or information on coding of motion vector. More specifically, the coding information on the maximum number of reference frames refers to, for example, information indicating a prediction reference direction, a size of motion vector, or an index of the frame to be referenced.

It has been described in this example that the third control parameter (param #3) is the maximum number of reference frames, but, for example, it may be replaced with information on inter-prediction. Furthermore, for example, the third control parameter (param #3) may be information indicating a frame rate of an input image signal. In this case, too, the initial value can be adjusted using the fact that the temporal correlation increases when the frame rate is higher, allowing further increase in coding efficiency.

The fourth control parameter (param #4) is, for example, the resolution of a picture which includes the slice, which is given by a given parameter. Specifically, at least one of the first to n-th initialization methods may depend on the resolution of a picture.

In the conventional method, only the correlation degree between a binary string and a quantization step for luminance can be reflected to the initialization process. According to the method above in Embodiment 1, the correlation degree between a binary string and the resolution of an input image can be reflected to the initialization process, using the coding information on the resolution of an input signal. As a result, the initialization process can be performed using the fact that the size of unit of the processing block is likely to increase or the amount of information included in a processing block is likely to decrease when the resolution is higher, allowing further increase in coding efficiency.

Here, the coding information on the resolution of an input signal refers to, for example, information on a unit of coding, or information on coding of quantized coefficient. More specifically, the coding information on the resolution of an input signal is, for example, information for distinguishing zero coefficient and non-zero coefficient, or information indicating the last position of a non-zero coefficient in a transform block.

The fifth control parameter (param #5) is, for example, a signal indicating the difference of slices (the position in a space of a current slice to be decoded). Specifically, at least one of the first to n-th initialization methods may depend on the position of the slice in a picture.

In the conventional method, only the correlation degree between a binary string and a quantization step for luminance can be reflected to the initialization process. According to the method above in Embodiment 1, correlation degree between a binary string and the characteristics of a slice can be reflected to the initialization process, using the coding information on slice characteristics. As a result, the initialization process can be performed using the fact that a non-reference slice (slice that is not referenced by another slice) is likely to have larger reduction in image quality, allowing further increase in coding efficiency.

Here, the coding information on the slice characteristics is, for example, information on the position of a slice, or information on the difference of slice coding methods.

A control parameter may have a fixed value. The fixed value may be the same value as n (the number of control parameters).

Here, the first to n-th control parameters may be independent from one another. Furthermore, it may also be that the first control parameter does not uniquely determine the other control parameters.

Furthermore, a control parameter may be another variable in the same slice, and may be (the value of) the signal type previously obtained by arithmetic decoding.

As described above, according to Embodiment 1, for initialization of context variables for a given group (a plurality of context Idx), an initial value of a probability can be set by switching into an initialization method using a control parameter suited for the information type (group).

Furthermore, with respect to group information or the like, the processing unit to be used may be determined in advance for each signal type to be coded, or may be changed according to header information (for example, information indicating a profile or another control parameter). Accordingly, it is possible to change initialization methods according to the characteristics of an input signal, allowing further increase in coding efficiency.

The correspondence between groups and indexes may be in such a relation that one of them includes the other. The important thing here is, in the relation among variables, indexes and initialization methods, the values of variables (or the value of each element in a binary string or the like) have a higher correlation (farther from 0, regardless of positive or negative value) with the values of the control parameters used in the initialization methods. For example, an initialization method different from the initialization method of H.264 which uses QP shown in FIG. 3A and FIG. 3B is applied to context variables for a second variable having a lower correlation with the value of the control parameter QP than the first variable. It is sufficient that a plurality of indexes are included in one group, to apply the same probability model as that of H.264 is applied to the present invention.

Descriptions have been given of the example where each element in a string have one of two values, 0 and 1. However, also in a case where each element have an n-bit multivalue or any one of three values, the present invention may be, of course, applied by selecting an appropriate control parameter for initialization of probability.

The initialization methods of context variables according to Embodiment 1 may also be applied to arithmetic coding methods. Specifically, context variables may be initialized, as shown in FIG. 6 to FIG. 8, in the arithmetic coding methods, too. Accordingly, the same advantageous effects can be obtained as the arithmetic decoding method above.

Embodiment 2

The processing described in Embodiment 1 can be simply implemented in an independent computer system, by recording, in a recording medium, a program for implementing the configurations of the moving picture coding method (image coding method) and the moving picture decoding method (image decoding method) described in Embodiment 1. The recording media may be any recording media as long as the program can be recorded, such as a magnetic disk, an optical disk, a magnetic optical disk, an IC card, and a semiconductor memory.

Hereinafter, the applications to the moving picture coding method (image coding method) and the moving picture decoding method (image decoding method) described in Embodiment 1 and systems using thereof will be described. The system has a feature of having an image coding and decoding apparatus that includes an image coding apparatus using the image coding method and an image decoding apparatus using the image decoding method. Other configurations in the system can be changed as appropriate depending on the cases.

Figure 9:
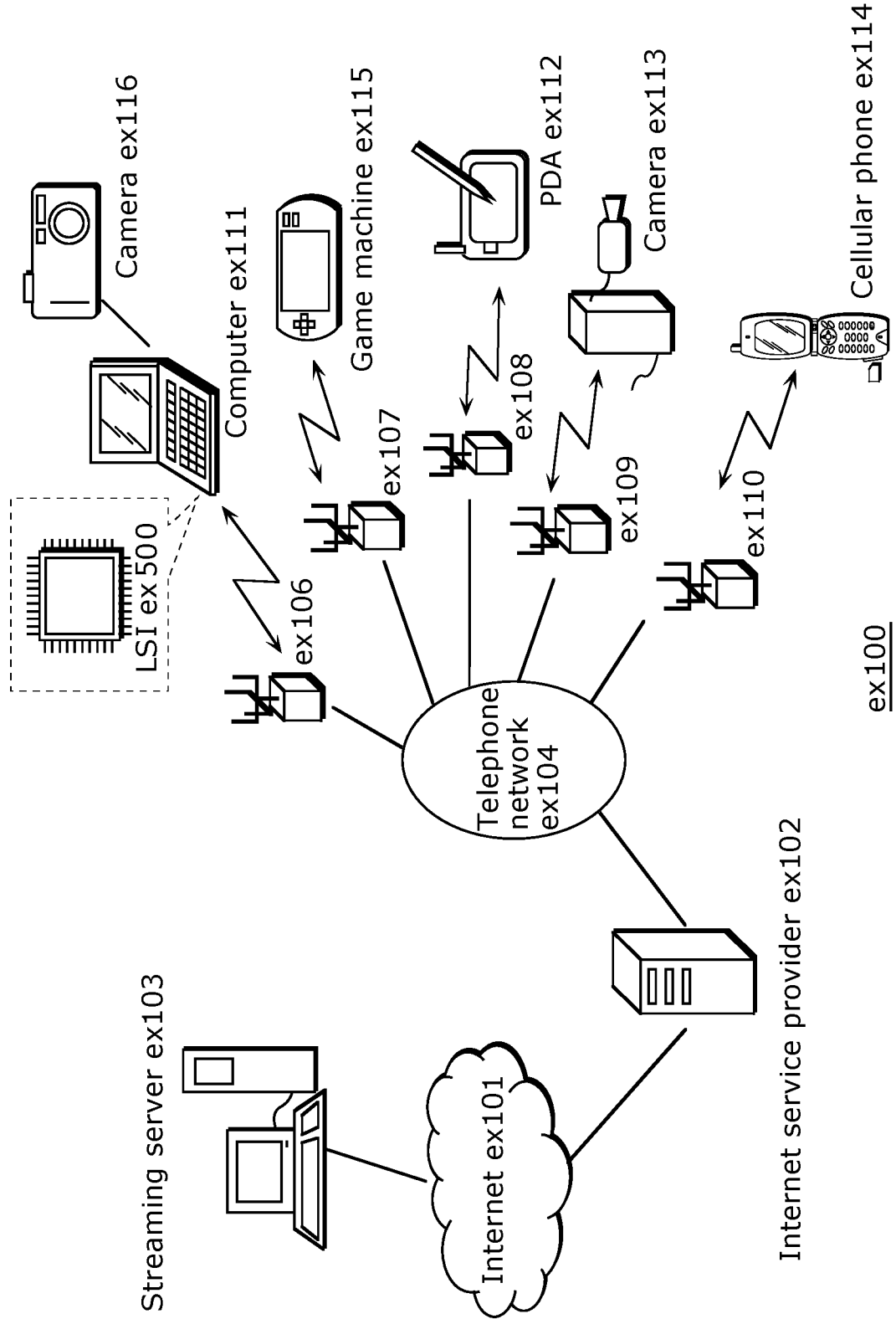
FIG. 9 shows an overall configuration of a content providing system for implementing content distribution services.

FIG. 9 illustrates an overall configuration of a content providing system ex100 for implementing content distribution services. The area for providing communication services is divided into cells of desired size, and base stations ex106, ex107, ex108, ex109, and ex110 which are fixed wireless stations are placed in each of the cells.

The content providing system ex100 is connected to devices, such as a computer ex111, a personal digital assistant (PDA) ex112, a camera ex113, a cellular phone ex114 and a game machine ex115, via the Internet ex101, an Internet service provider ex102, a telephone network ex104, as well as the base stations ex106 to ex110, respectively.

However, the configuration of the content providing system ex100 is not limited to the configuration shown in FIG. 9, and a combination in which any of the elements are connected is acceptable. In addition, each device may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing video. A camera ex116, such as a digital camera, is capable of capturing both still images and video. Furthermore, the cellular phone ex114 may be the one that meets any of the standards such as Global System for Mobile Communications (GSM) (registered trademark), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS).

In the content providing system ex100, a streaming server ex103 is connected to the camera ex113 and others via the telephone network ex104 and the base station ex109, which enables distribution of images of a live show and others. In such a distribution, a content (for example, video of a music live show) captured by the user using the camera ex113 is coded as described above in each of embodiments (i.e., the camera functions as the image coding apparatus according to an aspect of the present invention), and the coded content is transmitted to the streaming server ex103. On the other hand, the streaming server ex103 carries out stream distribution of the transmitted content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the coded data (i.e., functions as the image decoding apparatus according to an aspect of the present invention).

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and video captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for coding and decoding video may be integrated into some type of a recording medium (such as a CD-ROM, a flexible disk, and a hard disk) that is readable by the computer ex111 and others, and the coding and decoding processes may be performed using the software.

Furthermore, when the cellular phone ex114 is equipped with a camera, the video data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients may receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

Figure 10:
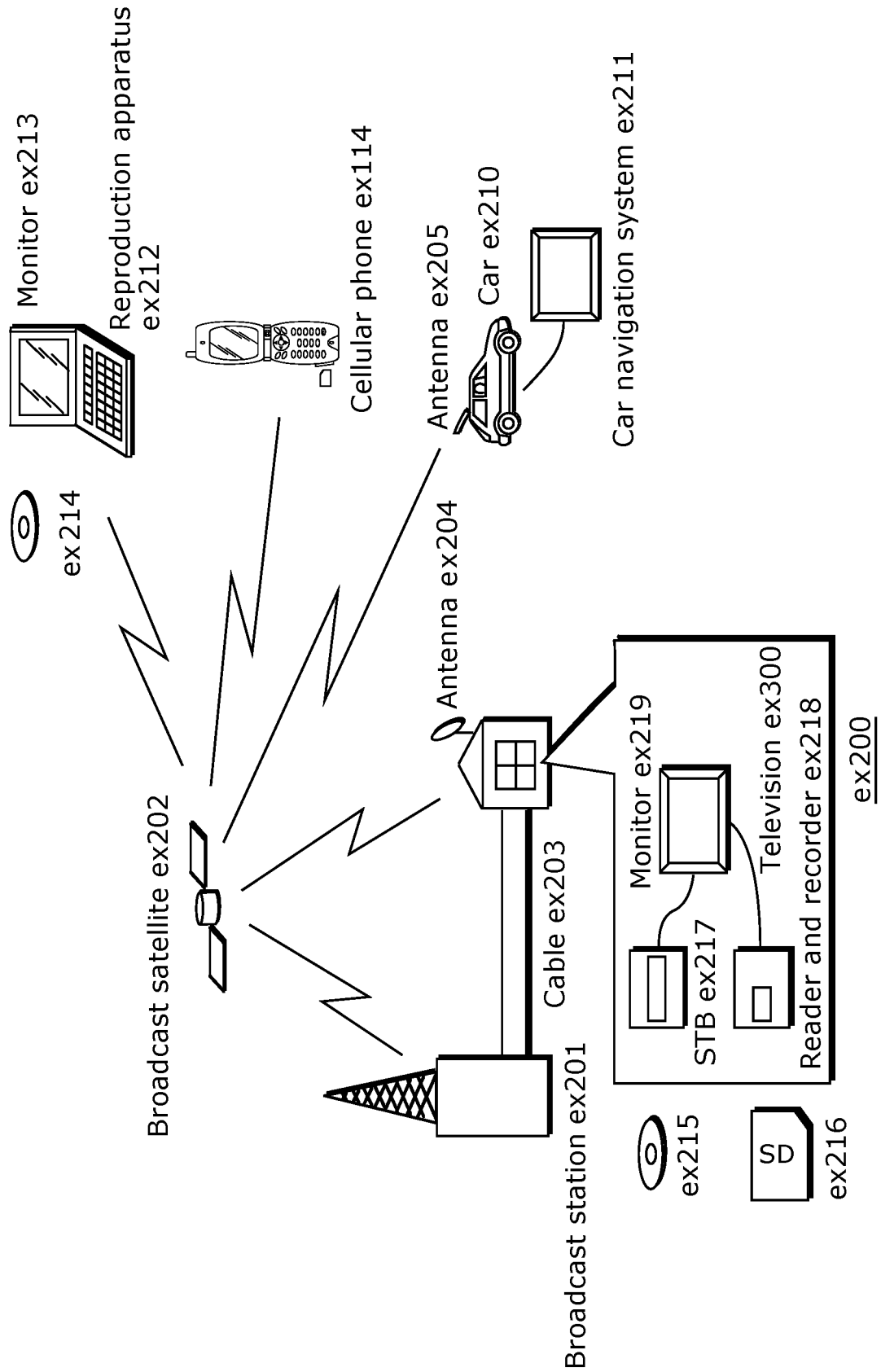
FIG. 10 shows an overall configuration of a digital broadcasting system.

Aside from the example of the content providing system ex100, at least one of the moving picture coding apparatus (image coding apparatus) and the moving picture decoding apparatus (image decoding apparatus) described in the above embodiment may be implemented in a digital broadcasting system ex200 illustrated in FIG. 10. More specifically, a broadcast station ex201 communicates or transmits, via radio waves to a broadcast satellite ex202, multiplexed data obtained by multiplexing audio data and others onto video data. The video data is data coded by the moving picture coding method described in the above embodiment (i.e., data coded by the image coding apparatus according to an aspect of the present invention). Upon receipt of the multiplexed data, the broadcast satellite ex202 transmits radio waves for broadcasting. Then, a home-use antenna ex204 with a satellite broadcast reception function receives the radio waves. Next, a device such as a television (receiver) ex300 and a set top box (STB) ex217 decodes the received multiplexed data, and reproduces the decoded data (i.e., functions as the image decoding apparatus according to an aspect of the present invention).

Furthermore, a reader/recorder ex218 (i) reads and decodes the multiplexed data recorded on a recording medium ex215, such as a DVD and a BD, or (i) codes video signals in the recording medium ex215, and in some cases, writes data obtained by multiplexing an audio signal on the coded data. The reader/recorder ex218 can include the moving picture decoding apparatus or the moving picture coding apparatus as shown in the above embodiment. In this case, the reproduced video signals are displayed on the monitor ex219, and can be reproduced by another device or system using the recording medium ex215 on which the multiplexed data is recorded. It is also possible to implement the moving picture decoding apparatus in the set top box ex217 connected to the cable ex203 for a cable television or to the antenna ex204 for satellite and/or terrestrial broadcasting, so as to display the video signals on the monitor ex219 of the television ex300. The moving picture decoding apparatus may be implemented not in the set top box but in the television ex300.

Figure 11:
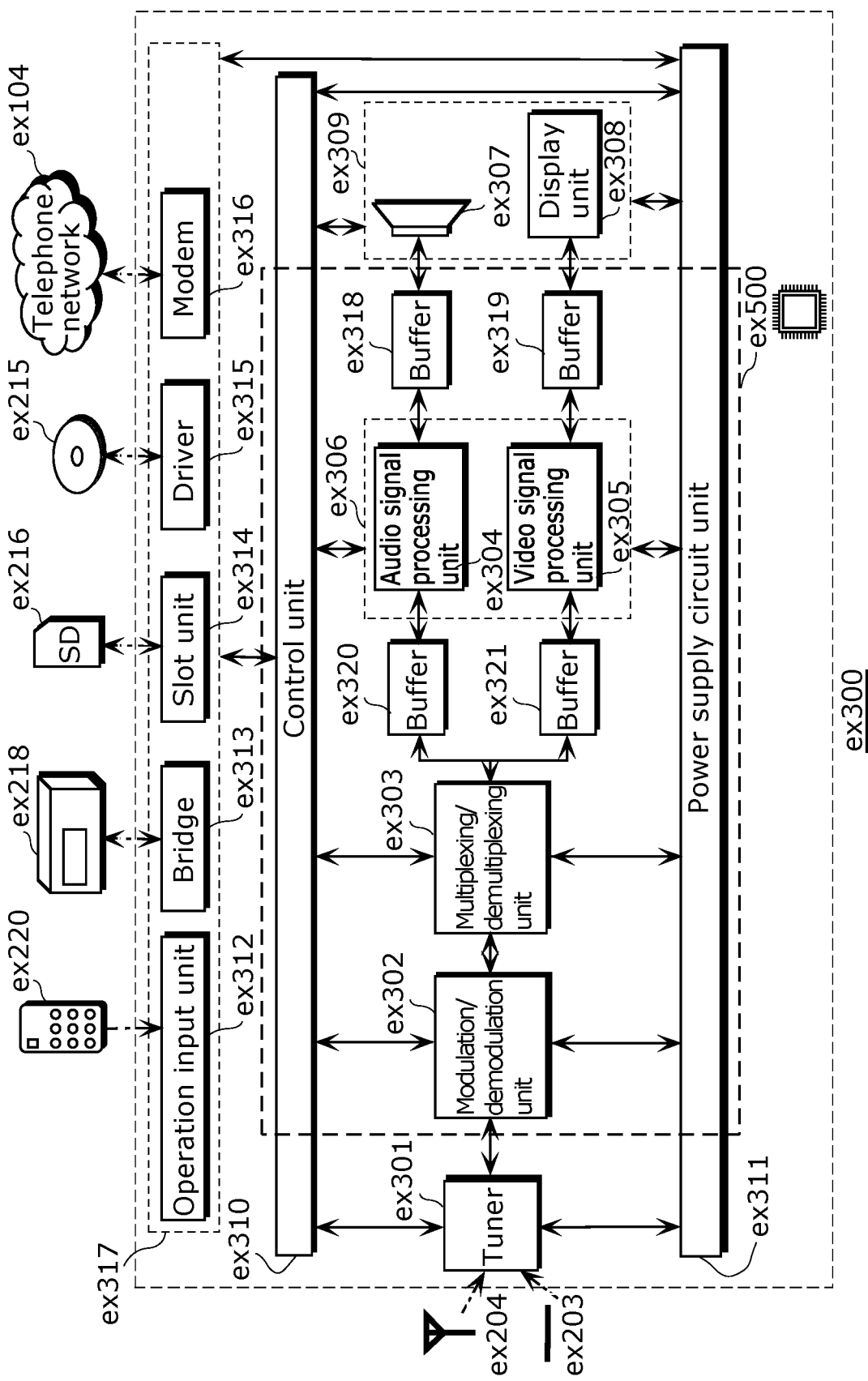
FIG. 11 shows a block diagram illustrating an example of a configuration of a television.

FIG. 11 illustrates the television (receiver) ex300 that uses the moving picture coding method and the moving picture decoding method described in the above embodiment. The television ex300 includes: a tuner ex301 that obtains or provides multiplexed data obtained by multiplexing audio data onto video data, through the antenna ex204 or the cable ex203, etc. that receives a broadcast; a modulation/demodulation unit ex302 that demodulates the received multiplexed data or modulates data into multiplexed data to be supplied outside; and a multiplexing/demultiplexing unit ex303 that demultiplexes the modulated multiplexed data into video data and audio data, or multiplexes video data and audio data coded by a signal processing unit ex306 into data.

The television ex300 further includes: a signal processing unit ex306 including an audio signal processing unit ex304 and a video signal processing unit ex305 that decode audio data and video data and code audio data and video data, respectively (which function as the image coding apparatus and the image decoding apparatus according to the aspects of the present invention); and an output unit ex309 including a speaker ex307 that provides the decoded audio signal, and a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to each other through a synchronous bus.

First, the configuration in which the television ex300 decodes multiplexed data obtained from outside through the antenna ex204 and others and reproduces the decoded data will be described. In the television ex300, upon a user operation through a remote controller ex220 and others, the multiplexing/demultiplexing unit ex303 demultiplexes the multiplexed data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in the above embodiment, in the television ex300. The output unit ex309 provides the decoded video signal and audio signal outside, respectively. When the output unit ex309 provides the video signal and the audio signal, the signals may be temporarily stored in buffers ex318 and ex319, and others so that the signals are reproduced in synchronization with each other. Furthermore, the television ex300 may read multiplexed data not through a broadcast and others but from the recording media ex215 and ex216, such as a magnetic disk, an optical disk, and a SD card. Next, a configuration in which the television ex300 codes an audio signal and a video signal, and transmits the data outside or writes the data on a recording medium will be described. In the television ex300, upon a user operation through the remote controller ex220 and others, the audio signal processing unit ex304 codes an audio signal, and the video signal processing unit ex305 codes a video signal, under control of the control unit ex310 using the coding method described in the above embodiment. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in the buffers ex320 and ex321, and others so that the signals are reproduced in synchronization with each other. Here, the buffers ex318, ex319, ex320, and ex321 may be plural as illustrated, or at least one buffer may be shared in the television ex300. Furthermore, data may be stored in a buffer so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be capable of only receiving, decoding, and providing outside data but not the coding, multiplexing, and providing outside data.

Furthermore, when the reader/recorder ex218 reads or writes multiplexed data from or on a recording medium, one of the television ex300 and the reader/recorder ex218 may decode or code the multiplexed data, and the television ex300 and the reader/recorder ex218 may share the decoding or coding.

Figure 12:
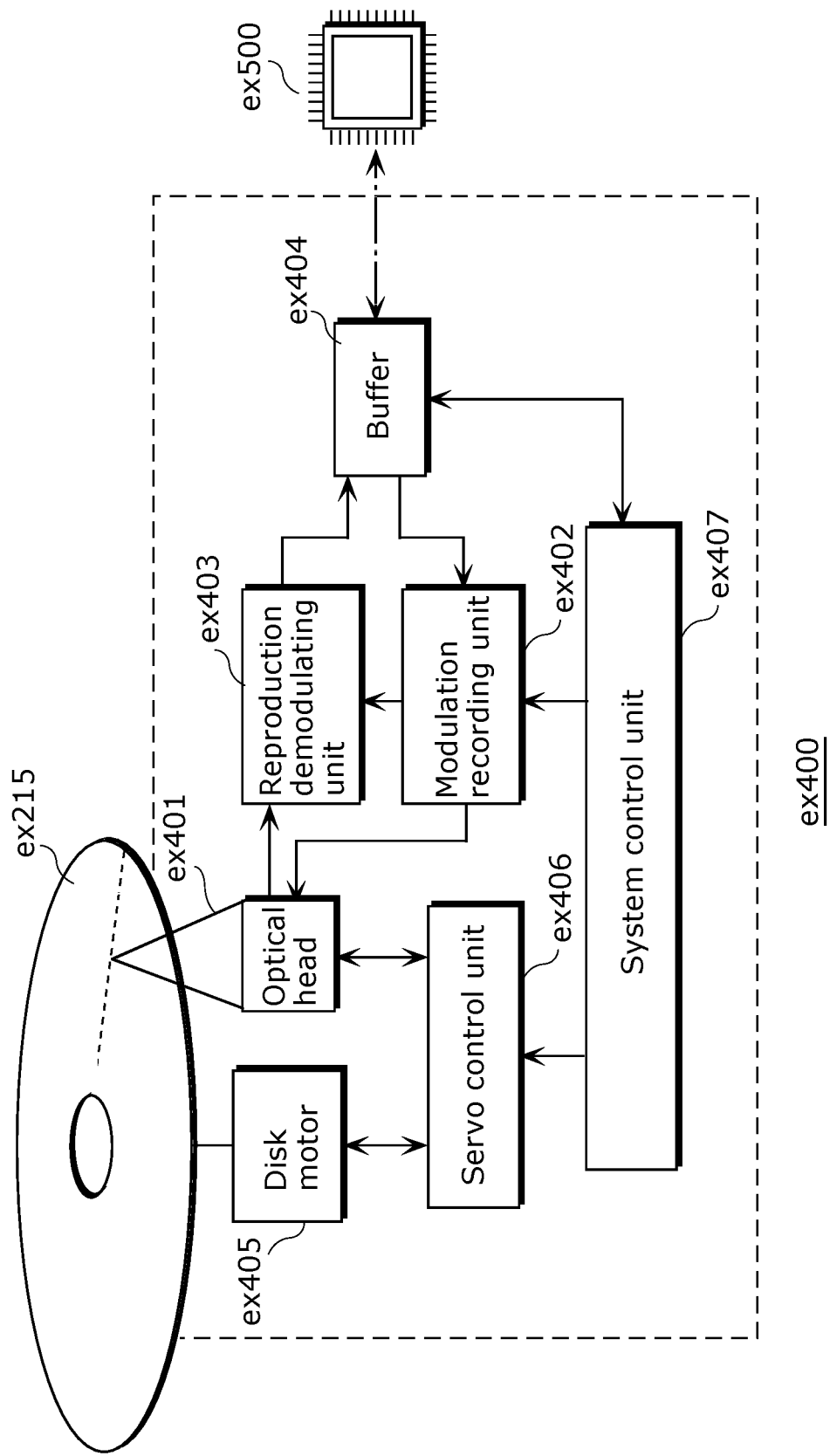
FIG. 12 shows a block diagram illustrating an example of a configuration of an information reproducing/recording unit that reads and writes information from and on a recording medium that is an optical disk.

As an example, FIG. 12 illustrates a configuration of an information reproducing/recording unit ex400 when data is read or written from or on an optical disk. The information reproducing/recording unit ex400 includes constituent elements ex401, ex402, ex403, ex404, ex405, ex406, and ex407 to be described hereinafter. The optical head ex401 irradiates a laser spot in a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. The disk motor ex405 rotates the recording medium ex215. The servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 13:
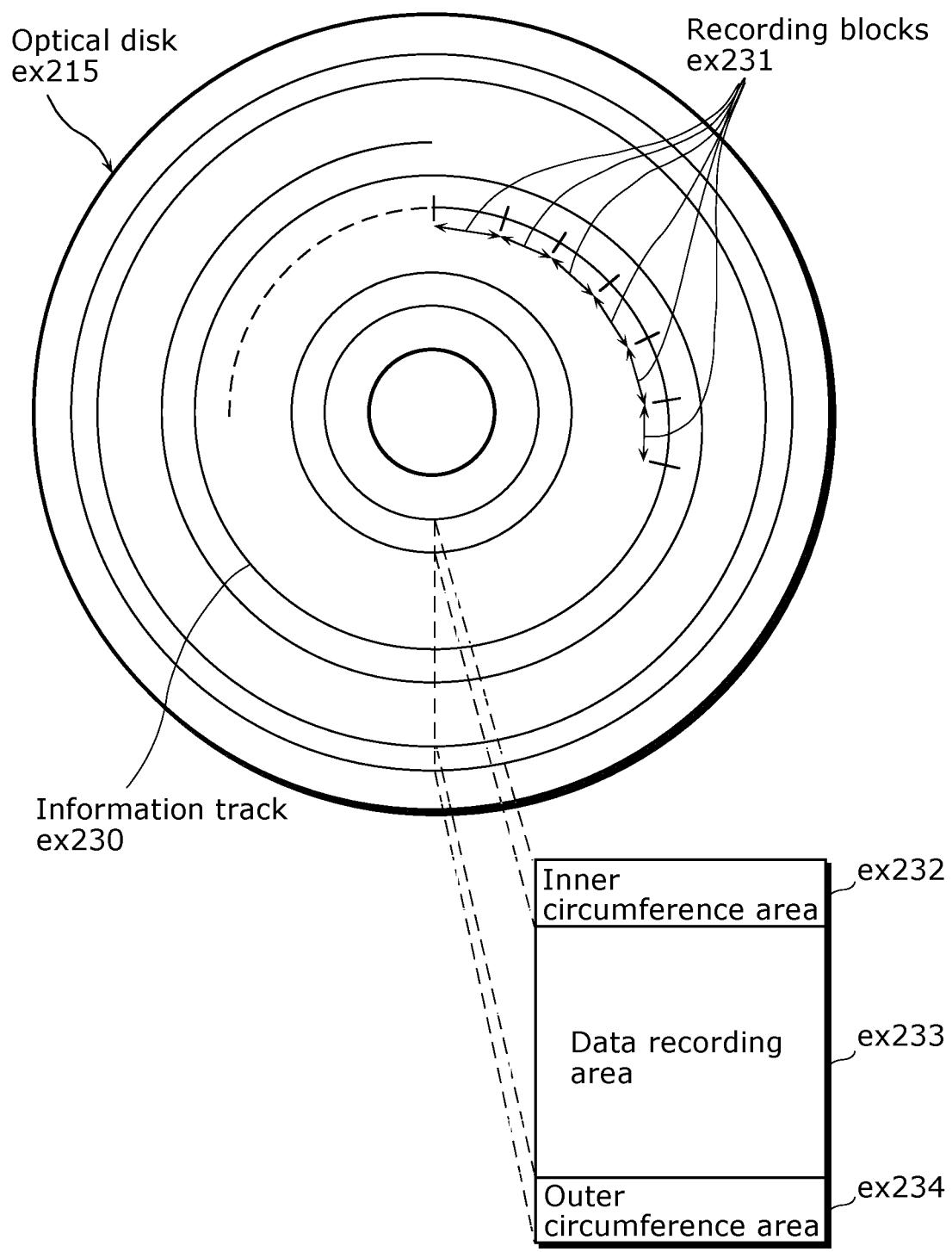
FIG. 13 shows an example of a configuration of a recording medium that is an optical disk.

FIG. 13 illustrates the recording medium ex215 that is the optical disk. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. Reproducing the information track ex230 and reading the address information in an apparatus that records and reproduces data can lead to determination of the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio, coded video data, or multiplexed data obtained by multiplexing the coded audio and video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording/reproduction, such as recording of information using light of colors with different wavelengths in the same portion of the optical disk and for recording information having different layers from various angles.

Furthermore, a car ex210 having an antenna ex205 can receive data from the satellite ex202 and others, and reproduce video on a display device such as a car navigation system ex211 set in the car ex210, in the digital broadcasting system ex200. Here, a configuration of the car navigation system ex211 will be a configuration, for example, including a GPS receiving unit from the configuration illustrated in FIG. 11. The same will be true for the configuration of the computer ex111, the cellular phone ex114, and others.

FIG. 14(a) illustrates the cellular phone ex114 that uses the moving picture coding method and the moving picture decoding method described in the above embodiment. The cellular phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The cellular phone ex114 further includes: a main body unit including an operation key unit ex366; an audio output unit ex357 such as a speaker for output of audio; an audio input unit ex356 such as a microphone for input of audio; a memory unit ex367 for storing captured video or still pictures, recorded audio, coded or decoded data of the received video, the still pictures, e-mails, or others; and a slot unit ex364 that is an interface unit for a recording medium that stores data in the same manner as the memory unit ex367.

Next, an example of a configuration of the cellular phone ex114 will be described with reference to FIG. 14(b). In the cellular phone ex114, a main control unit ex360 designed to control overall each unit of the main body including the display unit ex358 as well as the operation key unit ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulation/demodulation unit ex352, a multiplexing/demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the cellular phone ex114, the audio signal processing unit ex354 converts the audio signals collected by the audio input unit ex356 in voice conversation mode into digital audio signals under the control of the main control unit ex360 including a CPU, ROM, and RAM. Then, the modulation/demodulation unit ex352 performs spread spectrum processing on the digital audio signals, and the transmitting and receiving unit ex351 performs digital-to-analog conversion and frequency conversion on the data, so as to transmit the resulting data via the antenna ex350. Also, in the cellular phone ex114, the transmitting and receiving unit ex351 amplifies the data received by the antenna ex350 in voice conversation mode and performs frequency conversion and the analog-to-digital conversion on the data. Then, the modulation/demodulation unit ex352 performs inverse spread spectrum processing on the data, and the audio signal processing unit ex354 converts it into analog audio signals, so as to output them via the audio output unit ex357.

Furthermore, when an e-mail in data communication mode is transmitted, text data of the e-mail inputted by operating the operation key unit ex366 and others of the main body is sent out to the main control unit ex360 via the operation input control unit ex362. The main control unit ex360 causes the modulation/demodulation unit ex352 to perform spread spectrum processing on the text data, and the transmitting and receiving unit ex351 performs the digital-to-analog conversion and the frequency conversion on the resulting data to transmit the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and codes video signals supplied from the camera unit ex365 using the moving picture coding method shown in each of embodiments (i.e., functions as the image coding apparatus according to the aspect of the present invention), and transmits the coded video data to the multiplexing/demultiplexing unit ex353. In contrast, during when the camera unit ex365 captures video, still images, and others, the audio signal processing unit ex354 codes audio signals collected by the audio input unit ex356, and transmits the coded audio data to the multiplexing/demultiplexing unit ex353.

The multiplexing/demultiplexing unit ex353 multiplexes the coded video data supplied from the video signal processing unit ex355 and the coded audio data supplied from the audio signal processing unit ex354, using a predetermined method. Then, the modulation/demodulation unit (modulation/demodulation circuit unit) ex352 performs spread spectrum processing on the multiplexed data, and the transmitting and receiving unit ex351 performs digital-to-analog conversion and frequency conversion on the data so as to transmit the resulting data via the antenna ex350.

When receiving data of a video file which is linked to a Web page and others in data communication mode or when receiving an e-mail with video and/or audio attached, in order to decode the multiplexed data received via the antenna ex350, the multiplexing/demultiplexing unit ex353 demultiplexes the multiplexed data into a video data bit stream and an audio data bit stream, and supplies the video signal processing unit ex355 with the coded video data and the audio signal processing unit ex354 with the coded audio data, through the synchronous bus ex370. The video signal processing unit ex355 decodes the video signal using a moving picture decoding method corresponding to the moving picture coding method shown in the above embodiment (i.e., functions as the image decoding apparatus according to the aspect of the present invention), and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television ex300, a terminal such as the cellular phone ex114 probably have 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus. Although the digital broadcasting system ex200 receives and transmits the multiplexed data obtained by multiplexing audio data onto video data in the description, the multiplexed data may be data obtained by multiplexing not audio data but character data related to video onto video data, and may be not multiplexed data but video data itself.

As such, the moving picture coding method and the moving picture decoding method in the above embodiment can be used in any of the devices and systems described. Thus, the advantages described in the above embodiment can be obtained.

Furthermore, the present invention is not limited to the above embodiment, and various modifications and revisions are possible without departing from the scope of the present invention.

Embodiment 3

Video data can be generated by switching, as necessary, between (i) the moving picture coding method or the moving picture coding apparatus shown in the above embodiment and (ii) a moving picture coding method or a moving picture coding apparatus in conformity with a different standard, such as MPEG-2, MPEG-4 AVC, and VC-1.

Here, when a plurality of video data that conforms to the different standards is generated and is then decoded, the decoding methods need to be selected to conform to the different standards. However, since to which standard each of the plurality of the video data to be decoded conform cannot be detected, there is a problem that an appropriate decoding method cannot be selected.

In order to solve the problem, multiplexed data obtained by multiplexing audio data and others onto video data has a structure including identification information indicating to which standard the video data conforms. The specific structure of the multiplexed data including the video data generated in the moving picture coding method and by the moving picture coding apparatus shown in the above embodiment will be hereinafter described. The multiplexed data is a digital stream in the MPEG-2 Transport Stream format.

FIG. 15 illustrates a structure of the multiplexed data. As illustrated in FIG. 15, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part, and the presentation graphics stream represents subtitles of the movie. Here, the primary video is normal video to be displayed on a screen, and the secondary video is video to be displayed on a smaller window in the primary video. Furthermore, the interactive graphics stream represents an interactive screen to be generated by arranging the GUI components on a screen. The video stream is coded in the moving picture coding method or by the moving picture coding apparatus shown in the above embodiment, or in a moving picture coding method or by a moving picture coding apparatus in conformity with a conventional standard, such as MPEG-2, MPEG-4 AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary audio to be mixed with the primary audio.

Figure 16:
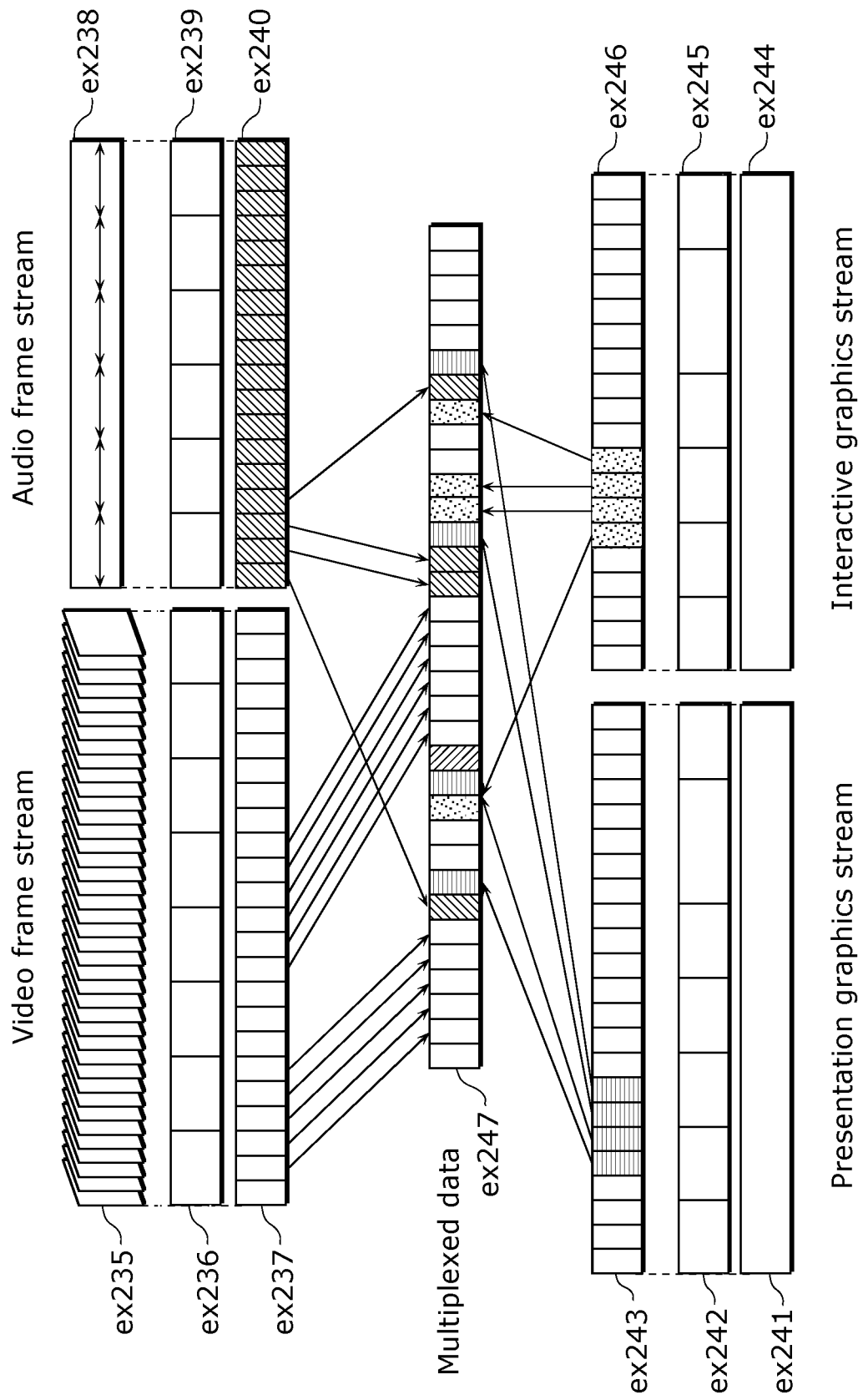
FIG. 16 schematically shows how each stream is multiplexed in multiplexed data.

FIG. 16 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets ex245, and further into TS packets ex243 and TS packets ex246, respectively. These TS packets are multiplexed into a stream to obtain multiplexed data ex247.

Figure 17:
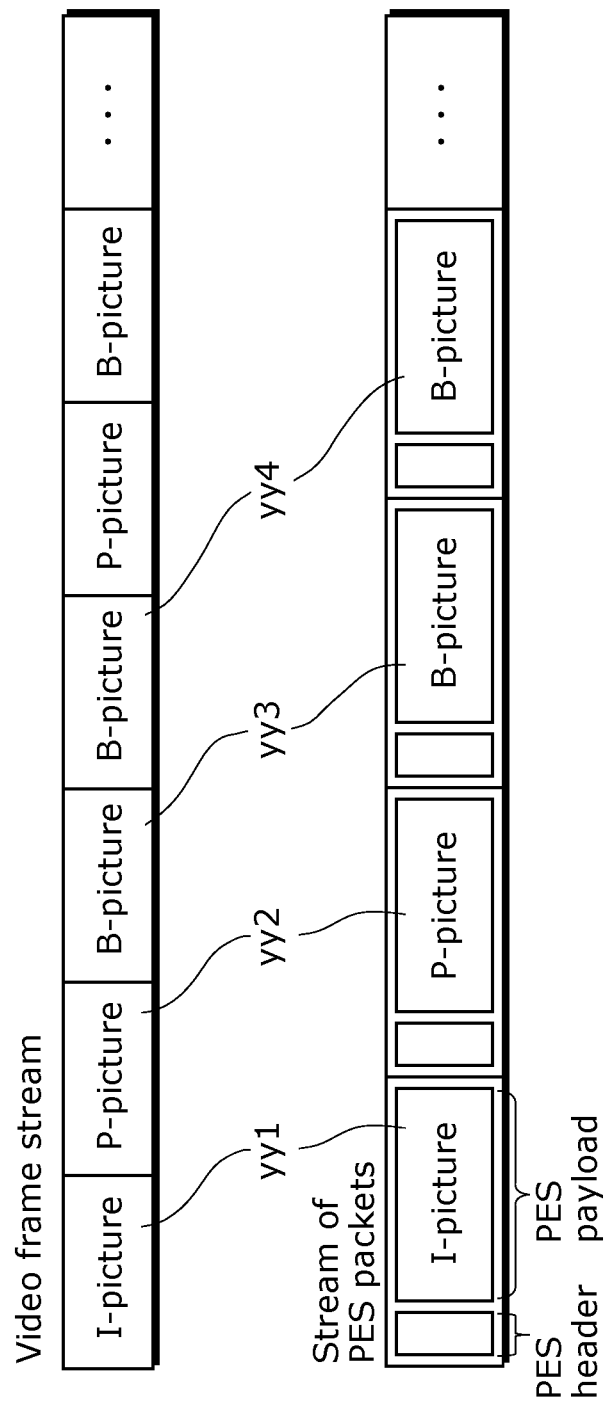
FIG. 17 shows how a video stream is stored in a stream of PES packets in more detail.

FIG. 17 illustrates how a video stream is stored in a stream of PES packets in more detail. The first bar in FIG. 17 shows a video frame stream in a video stream. The second bar shows the stream of PES packets. As indicated by arrows denoted as yy1, yy2, yy3, and yy4 in FIG. 17, the video stream is divided into pictures as I pictures, B pictures, and P pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

Figure 18:
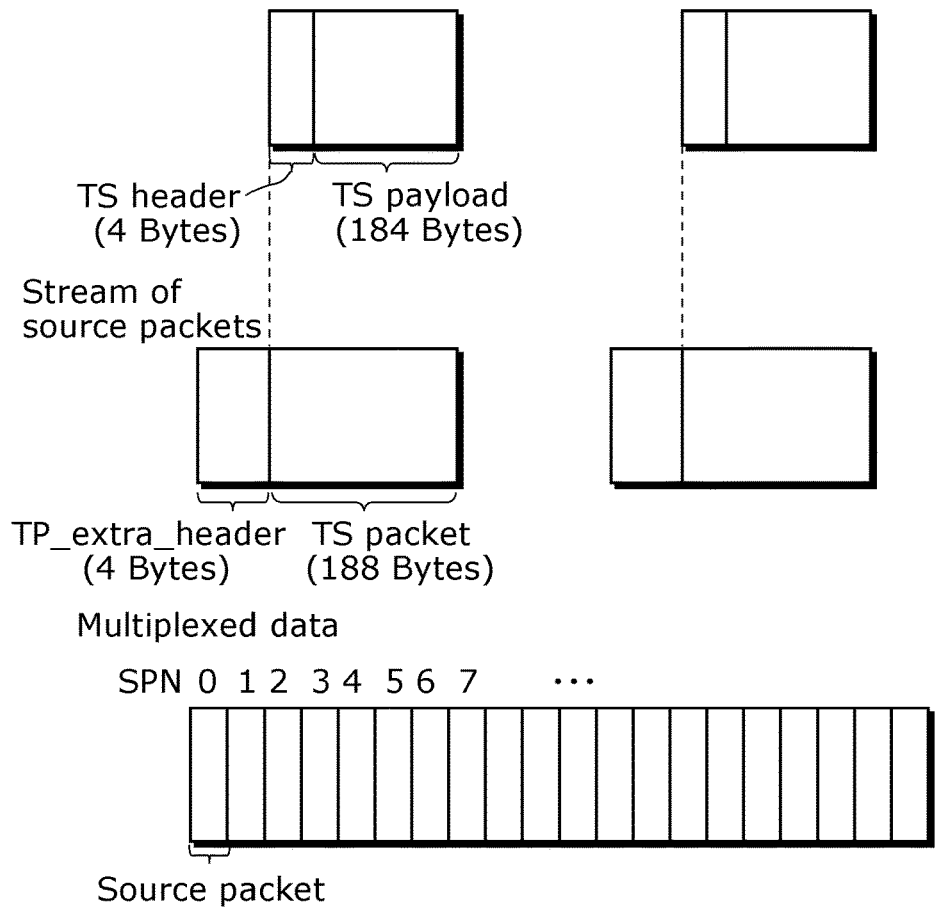
FIG. 18 shows a structure of TS packets and source packets in the multiplexed data.

FIG. 18 illustrates a format of TS packets to be finally written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The source packets are arranged in the multiplexed data as shown at the bottom of FIG. 18. The numbers incrementing from the head of the multiplexed data are called source packet numbers (SPNs).

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information of the streams corresponding to the PIDs. The PMT also has various descriptors relating to the multiplexed data. The descriptors have information such as copy control information showing whether copying of the multiplexed data is permitted or not.

The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

Figure 19:
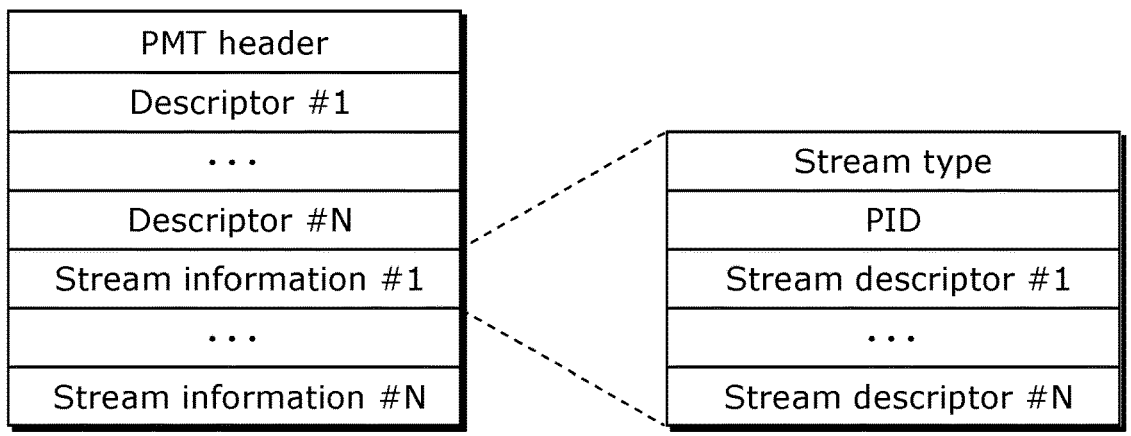
FIG. 19 shows a data structure of a PMT.

FIG. 19 illustrates the data structure of the PMT in detail. A PMT header is disposed at the top of the PMT. The PMT header describes the length of data included in the PMT and others. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec of a stream, a stream PID, and stream attribute information (such as a frame rate or an aspect ratio). The stream descriptors are equal in number to the number of streams in the multiplexed data.

When the multiplexed data is recorded on a recording medium and others, it is recorded together with multiplexed data information files.

Figure 20:
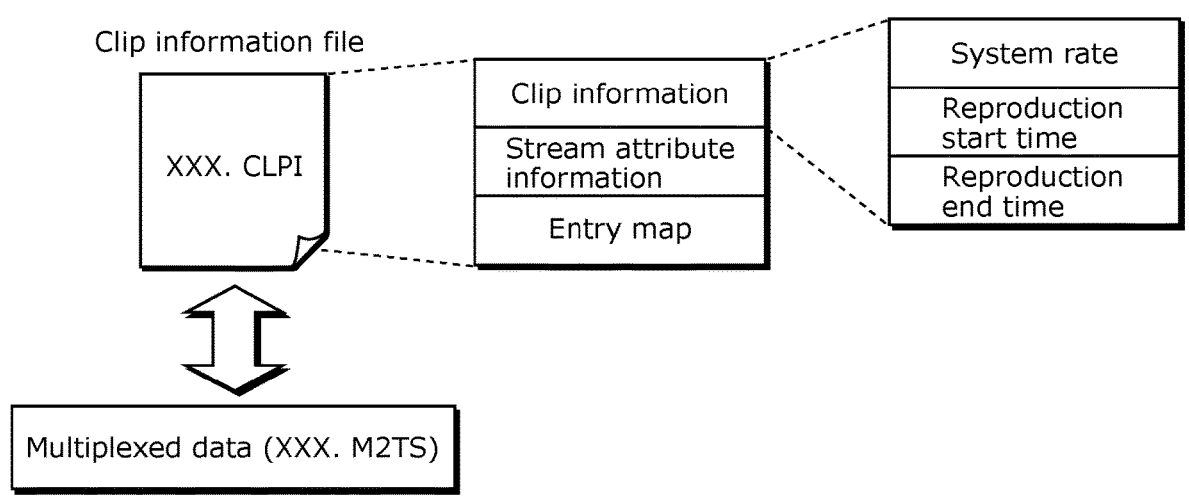
FIG. 20 shows an internal structure of multiplexed data information.

Each of the multiplexed data information files is management information of the multiplexed data as shown in FIG. 20. The multiplexed data information files are in one to one correspondence with the multiplexed data, and each of the files includes multiplexed data information, stream attribute information, and an entry map.

As illustrated in FIG. 20, the multiplexed data information includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

Figure 21:
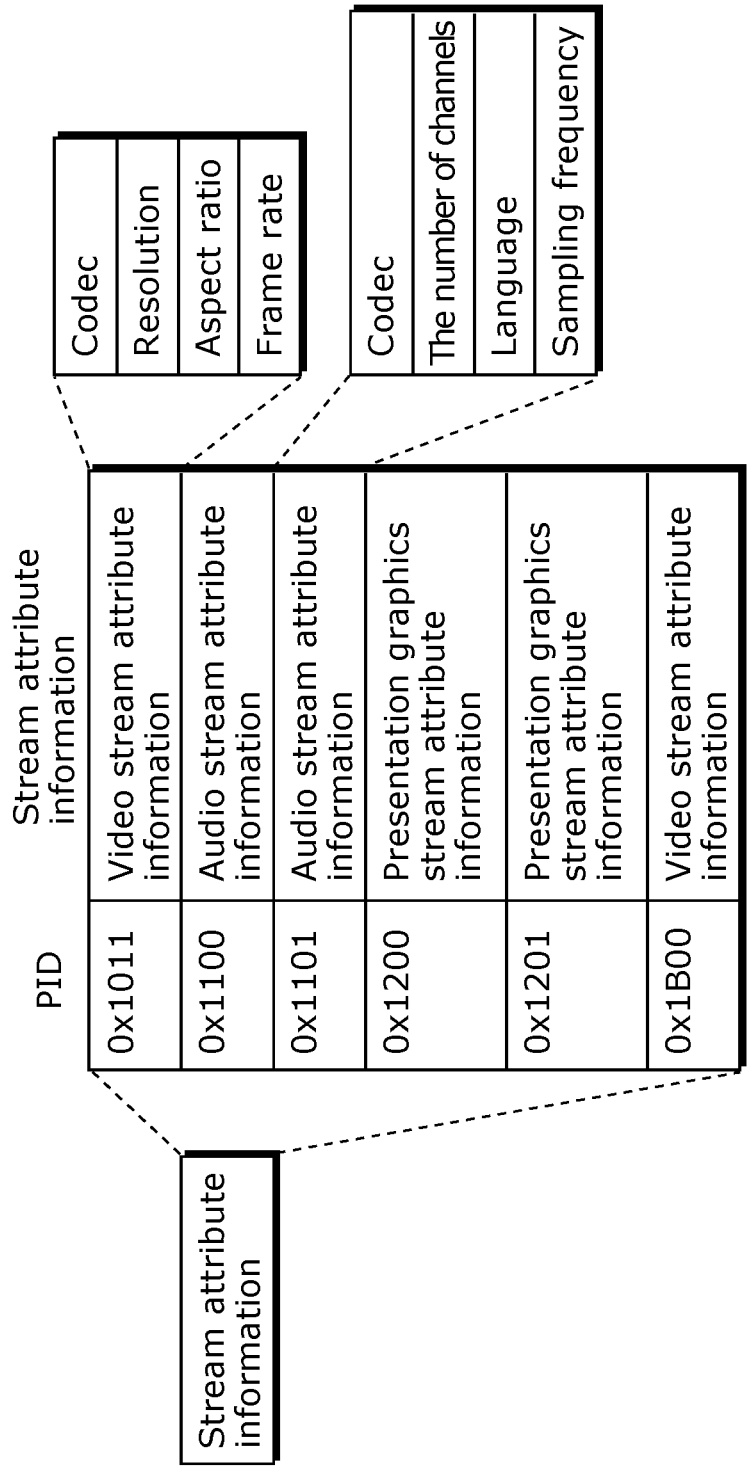
FIG. 21 shows an internal structure of stream attribute information.

As shown in FIG. 21, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data that is included in the video stream.

Each piece of audio stream attribute information carries information including what kind of compression codec is used for compressing the audio stream, how many channels are included in the audio stream, which language the audio stream supports, and how high the sampling frequency is. The video stream attribute information and the audio stream attribute information are used for initialization of a decoder before the player plays back the information.

In Embodiment 3, the multiplexed data to be used is of a stream type included in the PMT. Furthermore, when the multiplexed data is recorded on a recording medium, the video stream attribute information included in the multiplexed data information is used. More specifically, the moving picture coding method or the moving picture coding apparatus described in each of embodiments includes a step or a unit for allocating unique information indicating video data generated by the moving picture coding method or the moving picture coding apparatus in each of embodiments, to the stream type included in the PMT or the video stream attribute information. With the configuration, the video data generated by the moving picture coding method or the moving picture coding apparatus described in each of embodiments can be distinguished from video data that conforms to another standard.

Figure 22:
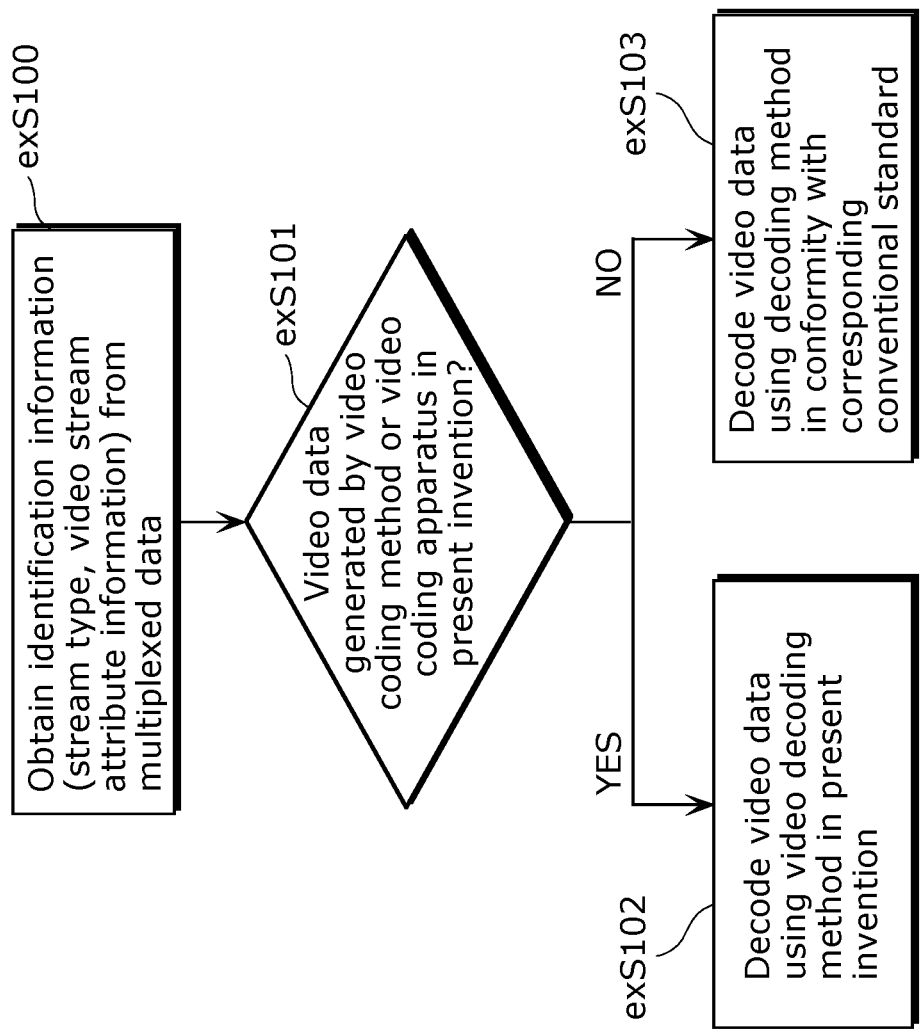
FIG. 22 shows steps for identifying video data.

Furthermore, FIG. 22 illustrates steps of the moving picture decoding method according to the present embodiment. In Step exS100, the stream type included in the PMT or the video stream attribute information included in the multiplexed data information is obtained from the multiplexed data. Next, in Step exS101, it is determined whether or not the stream type or the video stream attribute information indicates that the multiplexed data is generated by the moving picture coding method or the moving picture coding apparatus in each of embodiments. When it is determined that the stream type or the video stream attribute information indicates that the multiplexed data is generated by the moving picture coding method or the moving picture coding apparatus in each of embodiments, in Step exS102, decoding is performed by the moving picture decoding method in each of embodiments. Furthermore, when the stream type or the video stream attribute information indicates conformance to the conventional standards, such as MPEG-2, MPEG-4 AVC, and VC-1, in Step exS103, decoding is performed by a moving picture decoding method in conformity with the conventional standards.

As such, allocating a new unique value to the stream type or the video stream attribute information enables determination whether or not the moving picture decoding method or the moving picture decoding apparatus that is described in each of embodiments can perform decoding. Even when multiplexed data that conforms to a different standard is input, an appropriate decoding method or apparatus can be selected. Thus, it becomes possible to decode information without any error. Furthermore, the moving picture coding method or apparatus, or the moving picture decoding method or apparatus in the present embodiment can be used in the devices and systems described above.

Embodiment 4

Figure 23:
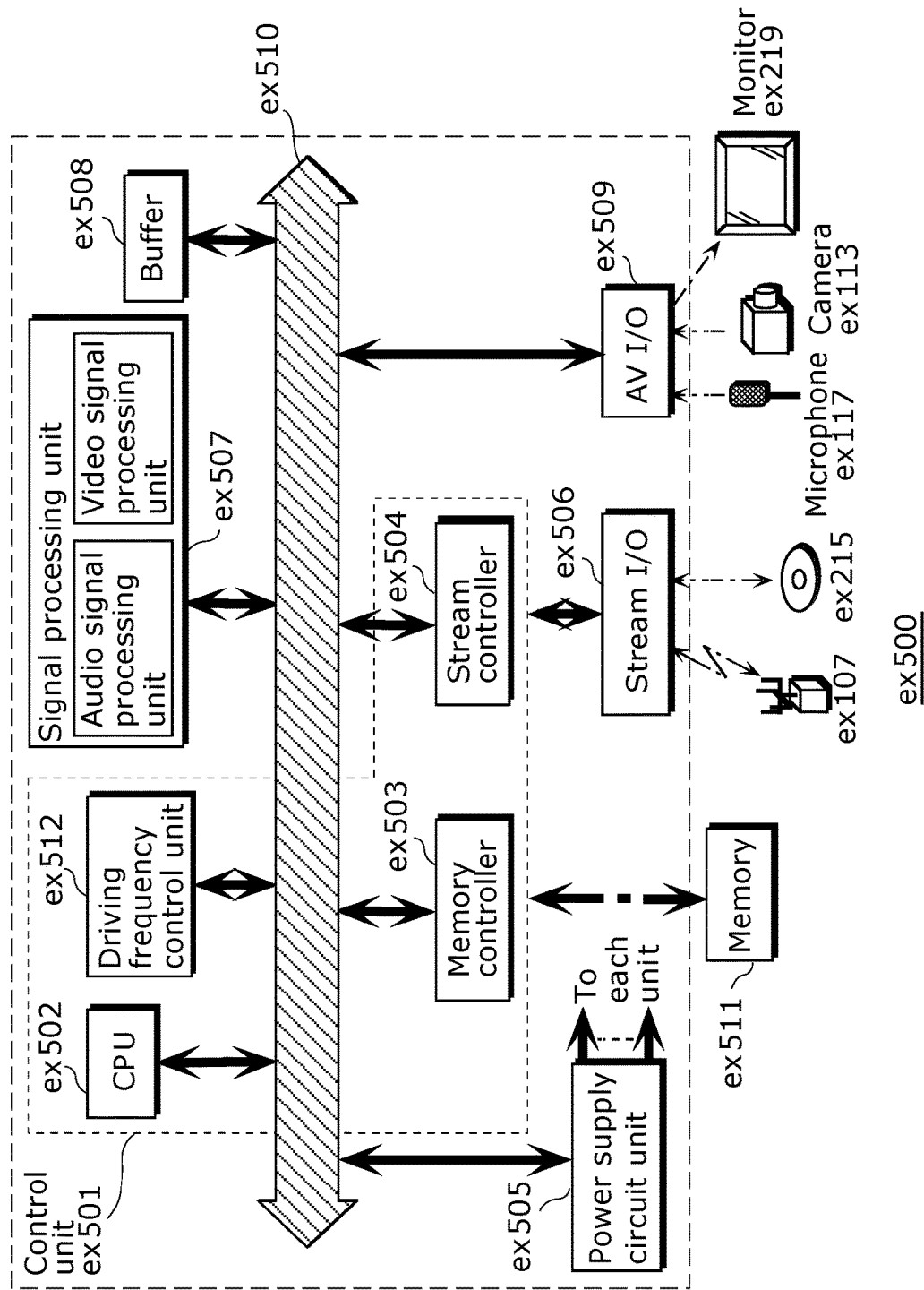
FIG. 23 shows an example of a configuration of an integrated circuit for implementing the moving picture coding method and the moving picture decoding method according to each of embodiments.

Each of the moving picture coding method, the moving picture coding apparatus, the moving picture decoding method, and the moving picture decoding apparatus in each of embodiments is typically achieved in the form of an integrated circuit or a Large Scale Integrated (LSI) circuit. As an example of the LSI, FIG. 23 illustrates a configuration of the LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV IO ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is sectioned into data portions according to the processing amount and speed to be transmitted to a signal processing unit ex507. Then, the signal processing unit ex507 codes an audio signal and/or a video signal. Here, the coding of the video signal is the coding described in each of embodiments. Furthermore, the signal processing unit ex507 sometimes multiplexes the coded audio data and the coded video data, and a stream IO ex506 provides the multiplexed data outside. The provided multiplexed data is transmitted to the base station ex107, or written on the recording medium ex215. When data sets are multiplexed, the data should be temporarily stored in the buffer ex508 so that the data sets are synchronized with each other.

Although the memory ex511 is an element outside the LSI ex500, it may be included in the LSI ex500. The buffer ex508 is not limited to one buffer, but may be composed of buffers. Furthermore, the LSI ex500 may be made into one chip or a plurality of chips.

Furthermore, although the control unit ex501 includes the CPU ex502, the memory controller ex503, the stream controller ex504, the driving frequency control unit ex512, the configuration of the control unit ex501 is not limited to such. For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present invention is applied to biotechnology.

Embodiment 5

When video data generated in the moving picture coding method or by the moving picture coding apparatus described in each of embodiments is decoded, compared to when video data that conforms to a conventional standard, such as MPEG-2, MPEG-4 AVC, and VC-1 is decoded, the processing amount probably increases. Thus, the LSI ex500 needs to be set to a driving frequency higher than that of the CPU ex502 to be used when video data in conformity with the conventional standard is decoded. However, when the driving frequency is set higher, there is a problem that the power consumption increases.

Figure 24:
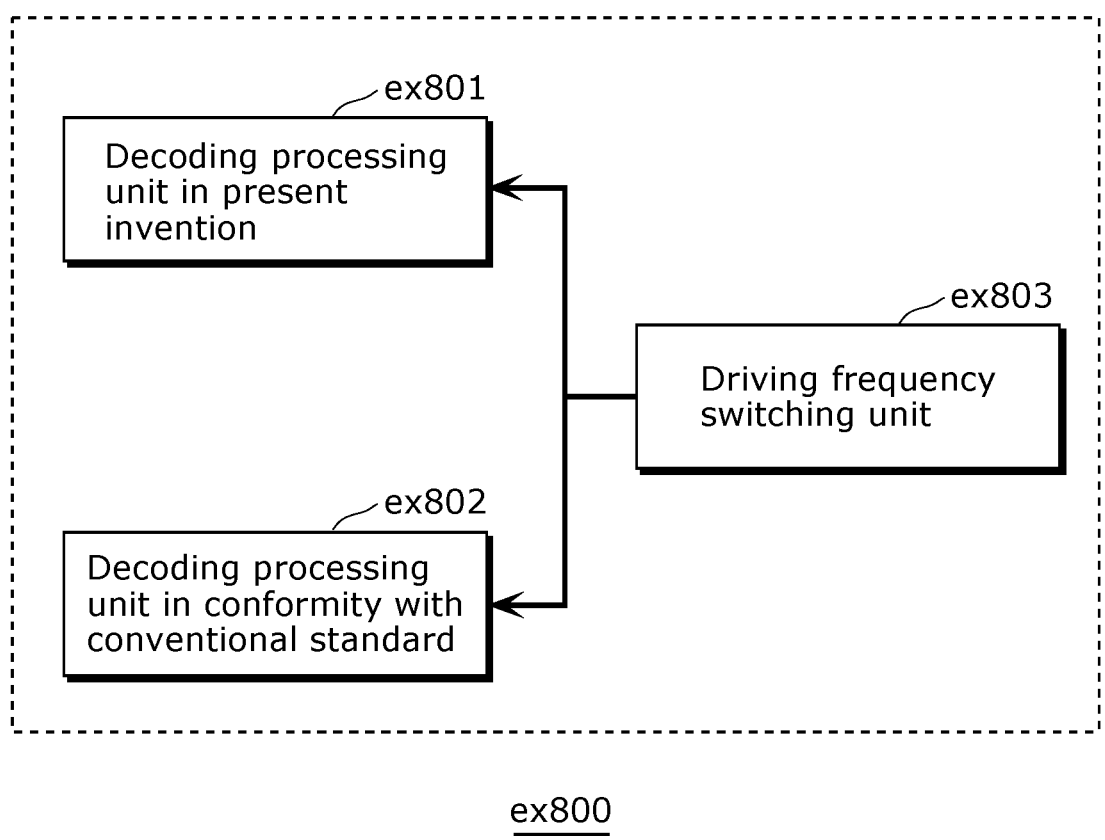
FIG. 24 shows a configuration for switching between driving frequencies.

In order to solve the problem, the moving picture decoding apparatus, such as the television ex300 and the LSI ex500 is configured to determine to which standard the video data conforms, and switch between the driving frequencies according to the determined standard. FIG. 24 illustrates a configuration ex800 in the present embodiment. A driving frequency switching unit ex803 sets a driving frequency to a higher driving frequency when video data is generated by the moving picture coding method or the moving picture coding apparatus described in each of embodiments. Then, the driving frequency switching unit ex803 instructs a decoding processing unit ex801 that executes the moving picture decoding method described in each of embodiments to decode the video data. When the video data conforms to the conventional standard, the driving frequency switching unit ex803 sets a driving frequency to a lower driving frequency than that of the video data generated by the moving picture coding method or the moving picture coding apparatus described in each of embodiments. Then, the driving frequency switching unit ex803 instructs the decoding processing unit ex802 that conforms to the conventional standard to decode the video data.

More specifically, the driving frequency switching unit ex803 includes the CPU ex502 and the driving frequency control unit ex512 in FIG. 23. Here, each of the decoding processing unit ex801 that executes the moving picture decoding method described in each of embodiments and the decoding processing unit ex802 that conforms to the conventional standard corresponds to the signal processing unit ex507 in FIG. 23. The CPU ex502 determines to which standard the video data conforms. Then, the driving frequency control unit ex512 determines a driving frequency based on a signal from the CPU ex502. Furthermore, the signal processing unit ex507 decodes the video data based on the signal from the CPU ex502. For example, the identification information described in Embodiment B is probably used for identifying the video data. The identification information is not limited to the one described in Embodiment 3 but may be any information as long as the information indicates to which standard the video data conforms. For example, when which standard video data conforms to can be determined based on an external signal for determining that the video data is used for a television or a disk, etc., the determination may be made based on such an external signal. Furthermore, the CPU ex502 selects a driving frequency based on, for example, a look-up table in which the standards of the video data are associated with the driving frequencies as shown in FIG. 26. The driving frequency can be selected by storing the look-up table in the buffer ex508 and in an internal memory of an LSI, and with reference to the look-up table by the CPU ex502.

Figure 25:
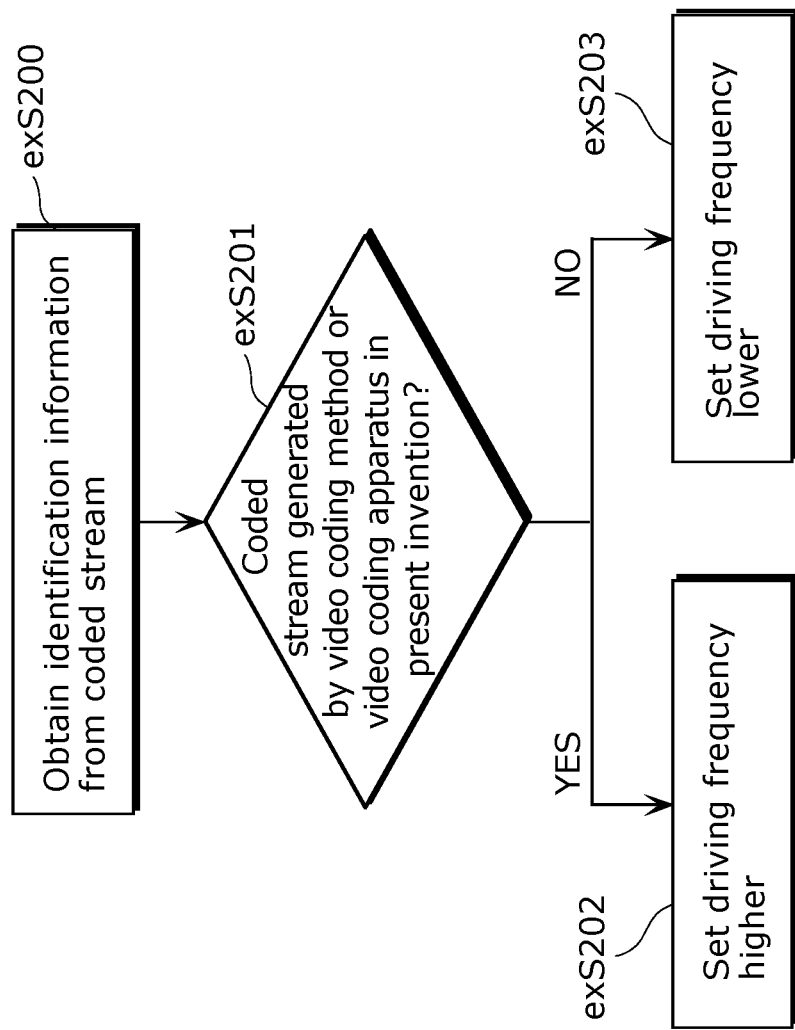
FIG. 25 shows steps for identifying video data and switching between driving frequencies.

FIG. 25 illustrates steps for executing a method in the present embodiment. First, in Step exS200, the signal processing unit ex507 obtains identification information from the multiplexed data. Next, in Step exS201, the CPU ex502 determines whether or not the video data is generated by the coding method and the coding apparatus described in each of embodiments, based on the identification information. When the video data is generated by the moving picture coding method and the moving picture coding apparatus described in each of embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to the conventional standard, such as MPEG-2, MPEG-4 AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the moving picture coding method and the moving picture coding apparatus described in each of embodiment.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the processing amount for decoding is larger, the driving frequency may be set higher, and when the processing amount for decoding is smaller, the driving frequency may be set lower as the method for setting the driving frequency. Thus, the setting method is not limited to the ones described above. For example, when the processing amount for decoding video data in conformity with MPEG-4 AVC is larger than the processing amount for decoding video data generated by the moving picture coding method and the moving picture coding apparatus described in each of embodiments, the driving frequency is probably set in reverse order to the setting described above.

Furthermore, the method for setting the driving frequency is not limited to the method for setting the driving frequency lower. For example, when the identification information indicates that the video data is generated by the moving picture coding method and the moving picture coding apparatus described in each of embodiments, the voltage to be applied to the LSI ex500 or the apparatus including the LSI ex500 is probably set higher. When the identification information indicates that the video data conforms to the conventional standard, such as MPEG-2, MPEG-4 AVC, and VC-1, the voltage to be applied to the LSI ex500 or the apparatus including the LSI ex500 is probably set lower. As another example, when the identification information indicates that the video data is generated by the moving picture coding method and the moving picture coding apparatus described in each of embodiments, the driving of the CPU ex502 does not probably have to be suspended. When the identification information indicates that the video data conforms to the conventional standard, such as MPEG-2, MPEG-4 AVC, and VC-1, the driving of the CPU ex502 is probably suspended at a given time because the CPU ex502 has extra processing capacity. Even when the identification information indicates that the video data is generated by the moving picture coding method and the moving picture coding apparatus described in each of embodiments, in the case where the CPU ex502 has extra processing capacity, the driving of the CPU ex502 is probably suspended at a given time. In such a case, the suspending time is probably set shorter than that in the case where when the identification information indicates that the video data conforms to the conventional standard, such as MPEG-2, MPEG-4 AVC, and VC-1.

Accordingly, the power conservation effect can be improved by switching between the driving frequencies in accordance with the standard to which the video data conforms. Furthermore, when the LSI ex500 or the apparatus including the LSI ex500 is driven using a battery, the battery life can be extended with the power conservation effect.

Embodiment 6

There are cases where a plurality of video data that conforms to different standards, is provided to the devices and systems, such as a television and a cellular phone. In order to enable decoding the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing units ex507 that conform to the respective standards.

In order to solve the problem, what is conceived is a configuration in which the decoding processing unit for implementing the moving picture decoding method described in each of embodiments and the decoding processing unit that conforms to the conventional standard, such as MPEG-2, MPEG-4 AVC, and VC-1 are partly shared. Ex900 in FIG. 128A shows an example of the configuration. For example, the moving picture decoding method described in each of embodiments and the moving picture decoding method that conforms to MPEG-4 AVC have, partly in common, the details of processing, such as entropy coding, inverse quantization, deblocking filtering, and motion compensated prediction. The details of processing to be shared probably include use of a decoding processing unit ex902 that conforms to MPEG-4 AVC. In contrast, a dedicated decoding processing unit ex901 is probably used for other processing unique to an aspect of the present invention. Since the aspect of the present invention is characterized by inverse quantization in particular, for example, the dedicated decoding processing unit ex901 is used for inverse quantization. Otherwise, the decoding processing unit is probably shared for one of the entropy decoding, deblocking filtering, and motion compensation, or all of the processing. The decoding processing unit for implementing the moving picture decoding method described in each of embodiments may be shared for the processing to be shared, and a dedicated decoding processing unit may be used for processing unique to that of MPEG-4 AVC.

Furthermore, ex1000 in FIG. 27(b) shows another example in that processing is partly shared. This example uses a configuration including a dedicated decoding processing unit ex1001 that supports the processing unique to an aspect of the present invention, a dedicated decoding processing unit ex1002 that supports the processing unique to another conventional standard, and a decoding processing unit ex1003 that supports processing to be shared between the moving picture decoding method according to the aspect of the present invention and the conventional moving picture decoding method. Here, the dedicated decoding processing units ex1001 and ex1002 are not necessarily specialized for the processing according to the aspect of the present invention and the processing of the conventional standard, respectively, and may be the ones capable of implementing general processing. Furthermore, the configuration of the present embodiment can be implemented by the LSI ex500.

As such, reducing the scale of the circuit of an LSI and reducing the cost are possible by sharing the decoding processing unit for the processing to be shared between the moving picture decoding method according to the aspect of the present invention and the moving picture decoding method in conformity with the conventional standard.

INDUSTRIAL APPLICABILITY

The arithmetic decoding method and the arithmetic coding method according to the present invention are usable as an image decoding method and an image coding method. Such image decoding method and imaging coding method are usable in various applications including high-resolution information display apparatuses or imaging apparatuses, such as, televisions, digital video recorders, car navigation systems, mobile phones, digital cameras, and digital video cameras.

REFERENCE SIGNS LIST

300 Arithmetic decoding unit
301 Binary arithmetic decoder
302 Symbol probability storing unit
303 Context control unit
304 Debinarization unit
400 Image decoding apparatus
410 Entropy decoding unit
420 Inverse quantization and inverse transformation unit
425 Adder
430 Deblocking filter
440 Memory
450 Intra prediction unit
460 Motion compensation unit
470 Intra and inter changing switch

The invention claimed is:
1. A binary arithmetic decoding method for decoding a plurality of parameters included in a binary string, the binary arithmetic decoding method comprising:
  initializing a context variable for each of the parameters, the context variable specifying a probability of a possible value of the parameter; and
  arithmetic decoding, using the context variable as an initial value, on the parameter which corresponds to a value of a given variable,
  wherein each of the parameters has an initializing method from among a plurality of initializing methods for initializing the context variables, and
  wherein in the initializing, either one of a first initializing method and a second initializing method different from the first initializing method is selected for the parameter from among the plurality of initializing methods, (i) the context variable being initialized by the first initializing method when the first initialized method is selected and (ii) the context variable being initialized by the second initializing method when the second initialized method is selected.

2. An arithmetic coding method for coding a plurality of parameters included in a binary string, the binary arithmetic coding method comprising:
  initializing a context variable for each parameter, the context variable specifying a probability of a possible value of the parameter; and arithmetic coding, using the context variable as an initial value, on the parameter which corresponds to a value of a given variable, wherein each of the parameters has an initializing method from among a plurality of initializing methods for initializing the context variables, and wherein in the initializing, either one of a first initializing method and a second initializing method different from the first initializing method is selected for the parameter from among the plurality of initializing methods, (i) the context variable being initialized by the first initializing method when the first initialized method is selected and (ii) the context variable being initialized by the second initializing method when the second initialized method is selected.

* * * * *